(12) United States Patent
Kang

(10) Patent No.: US 11,532,641 B2
(45) Date of Patent: Dec. 20, 2022

(54) SEMICONDUCTOR DEVICE WITH FERROELECTRICITY

(71) Applicant: SK hynix Inc., Icheon-si Gyeonggi-do (KR)

(72) Inventor: In Ku Kang, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 116 days.

(21) Appl. No.: 17/027,390

(22) Filed: Sep. 21, 2020

(65) Prior Publication Data

US 2021/0335820 A1 Oct. 28, 2021

(30) Foreign Application Priority Data

Apr. 27, 2020 (KR) .................. 10-2020-0050932

(51) Int. Cl.
| | |
|---|---|
| *H01L 27/11597* | (2017.01) |
| *H01L 27/11587* | (2017.01) |
| *G11C 15/04* | (2006.01) |
| *H01L 27/11563* | (2017.01) |
| *H01L 27/11585* | (2017.01) |

(52) U.S. Cl.
CPC ........ *H01L 27/11597* (2013.01); *G11C 15/04* (2013.01); *G11C 15/046* (2013.01); *H01L 27/11563* (2013.01); *H01L 27/11585* (2013.01); *H01L 27/11587* (2013.01)

(58) Field of Classification Search
CPC . G11C 15/04; G11C 15/046; H01L 27/11563; H01L 27/11585; H01L 27/11587; H01L 27/11597
See application file for complete search history.

(56) References Cited

U.S. PATENT DOCUMENTS

| | | | |
|---|---|---|---|
| 2019/0296122 A1 | 9/2019 | Ino et al. | |
| 2021/0082956 A1* | 3/2021 | Suzuki | ............... H01L 27/1159 |
| 2021/0082957 A1* | 3/2021 | Sakuma | ............ H01L 27/11585 |

FOREIGN PATENT DOCUMENTS

KR 101872122 B1 6/2018

OTHER PUBLICATIONS

T.S. Boscke et al., Ferroelectricity in hafnium oxide thin films, Applied Physics Letters 99, 102903 (2011), Sep. 8, 2011, 2011 American Institute of Physics.

* cited by examiner

*Primary Examiner* — Matthew E Warren
(74) *Attorney, Agent, or Firm* — William Park & Associates Ltd.

(57) ABSTRACT

A semiconductor device includes: a stack structure including conductive patterns and insulating layers, which are alternately stacked; a channel structure penetrating the stack structure; and a memory layer penetrating the stack structure, the memory layer being disposed between the channel structure and the stack structure. The memory layer includes memory parts and dummy parts, which are alternately arranged. Each of the memory parts includes a first part between the insulating layers and a second part between the dummy parts. The first part of the memory parts have ferroelectricity.

17 Claims, 27 Drawing Sheets

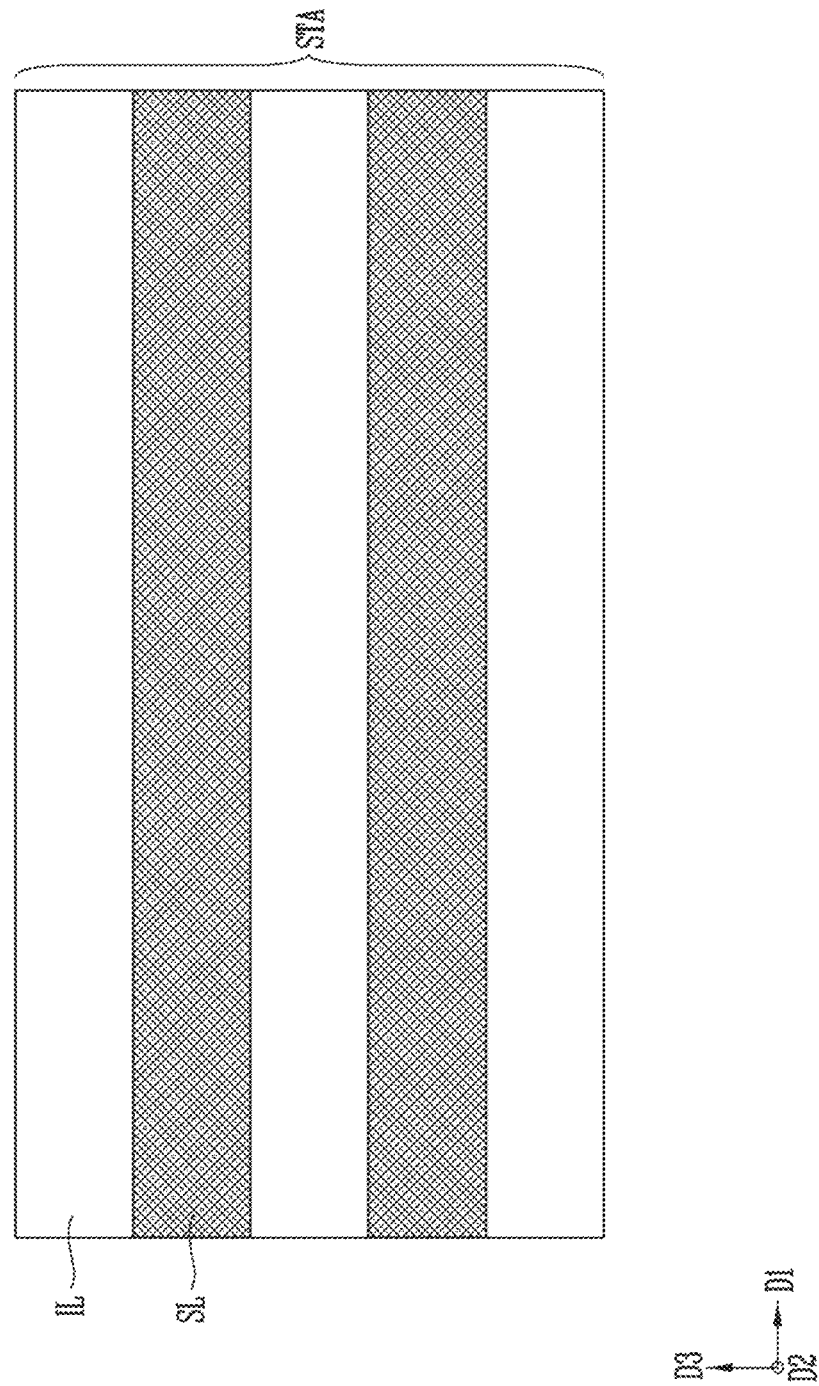

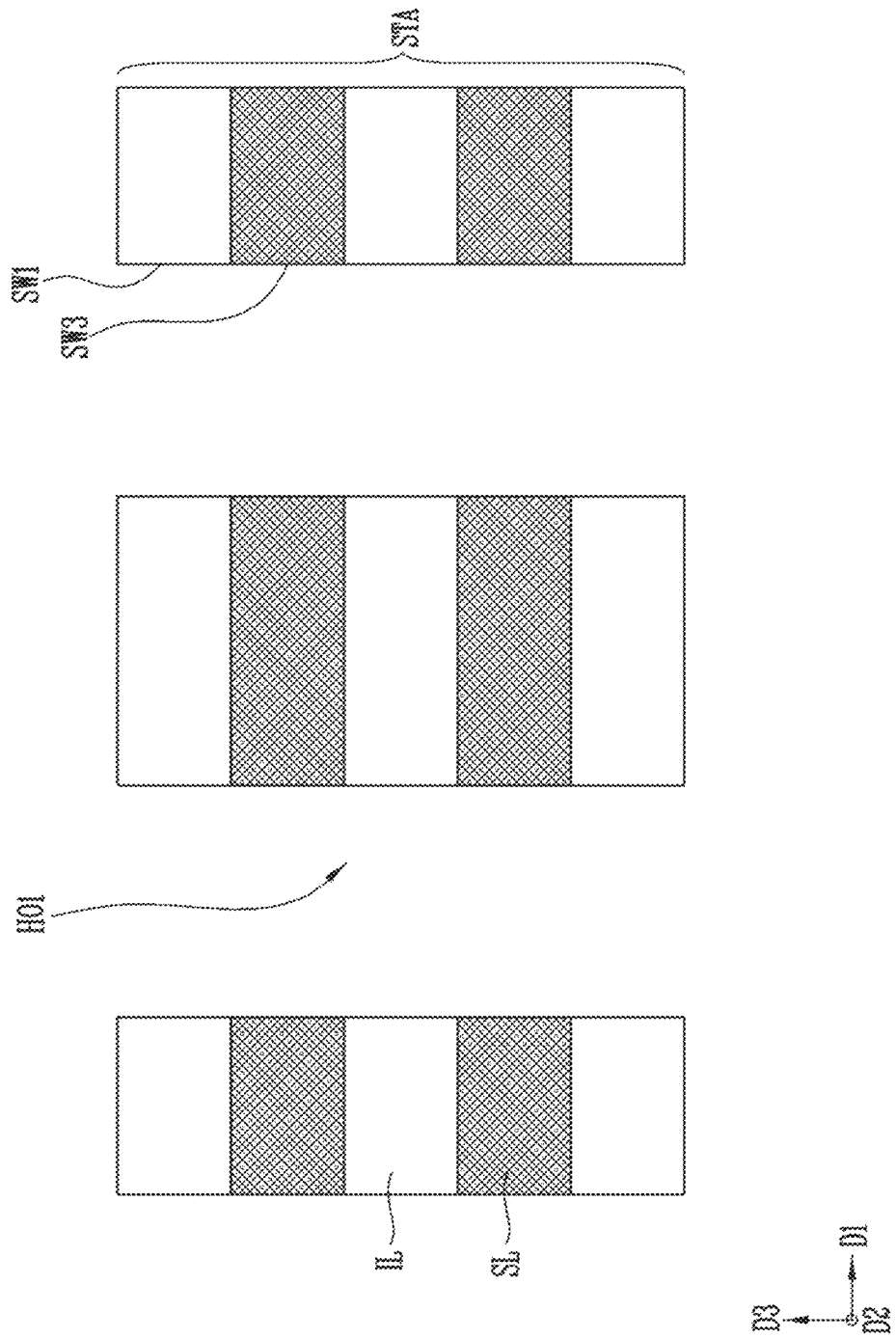

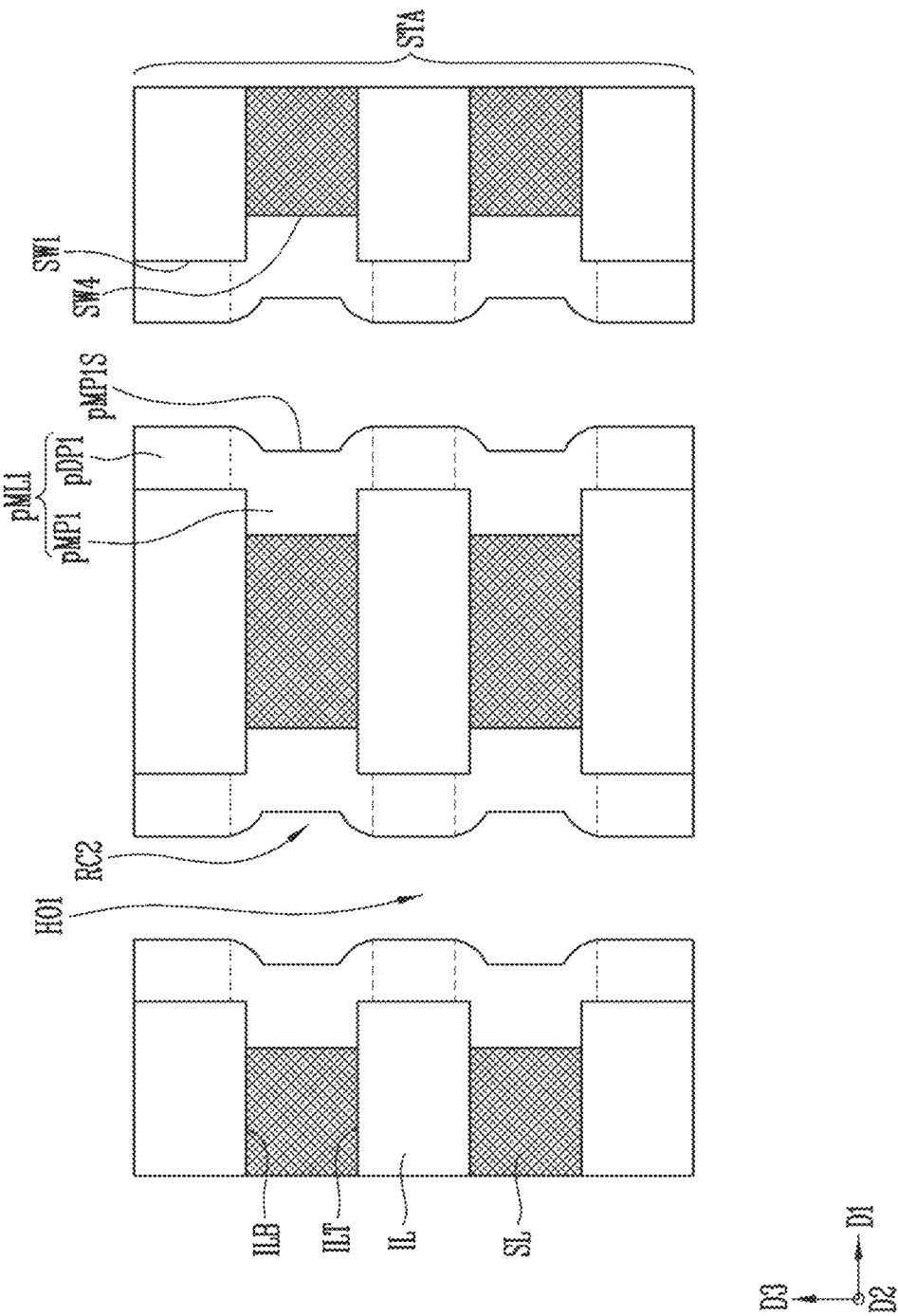

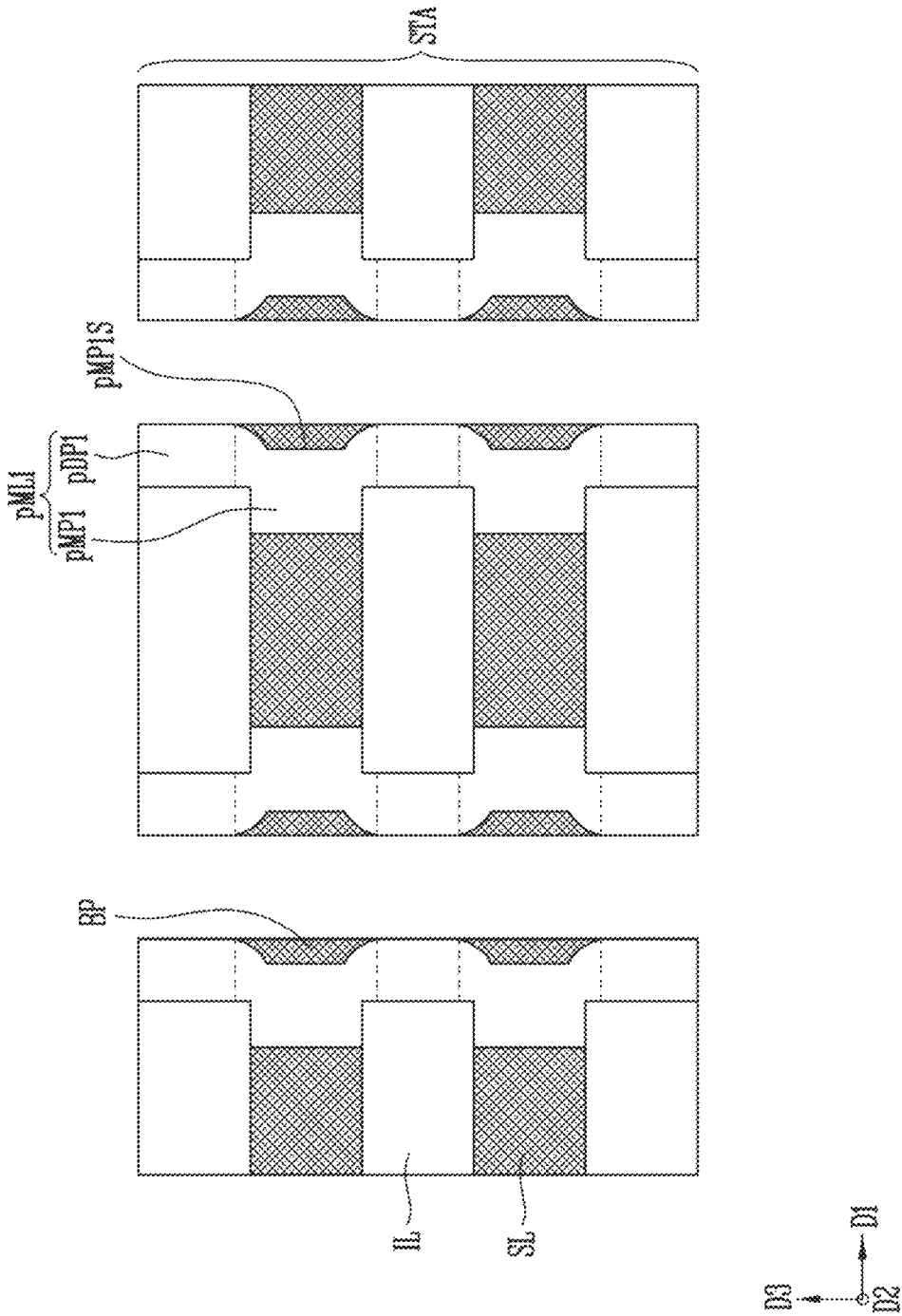

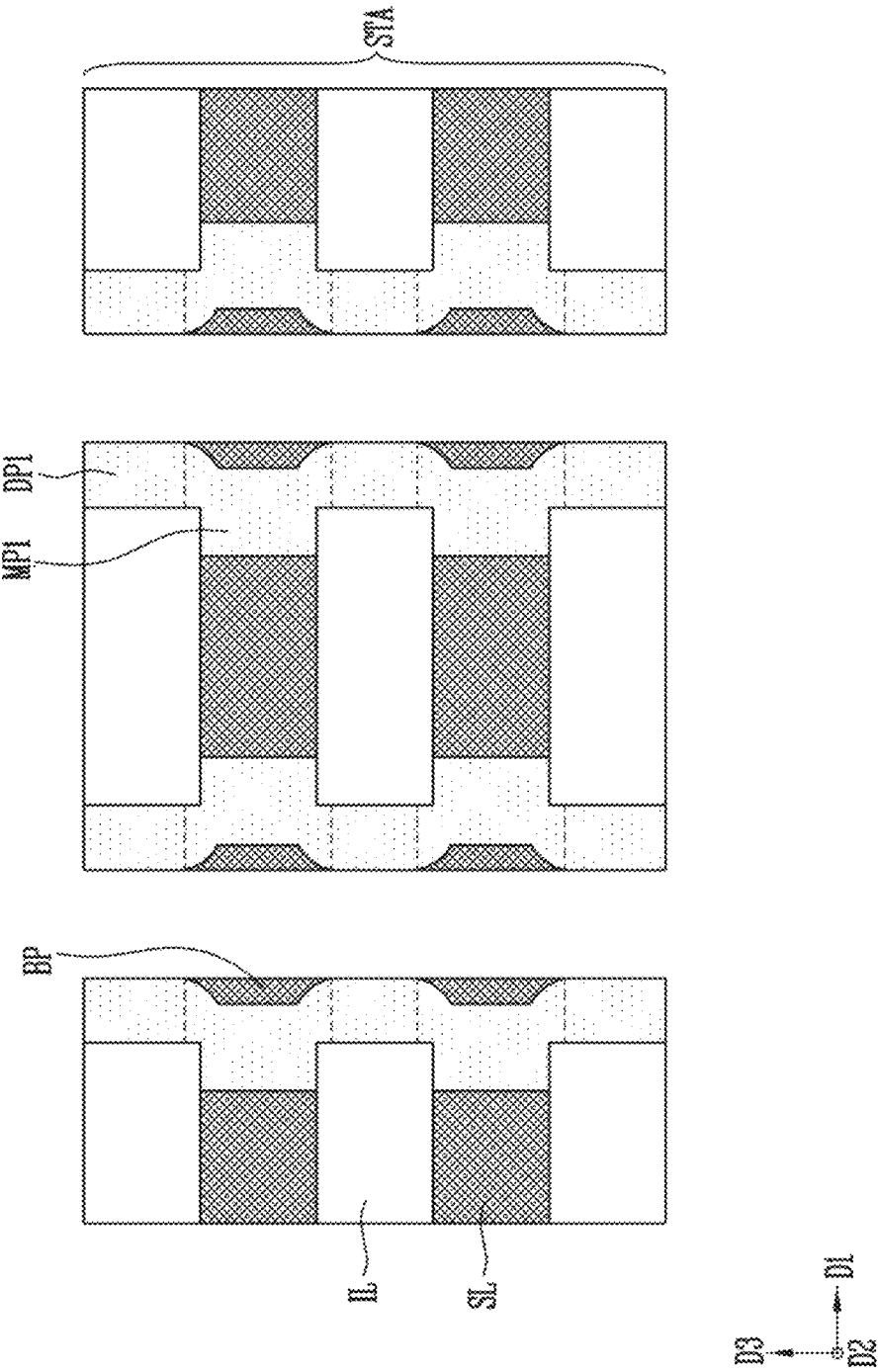

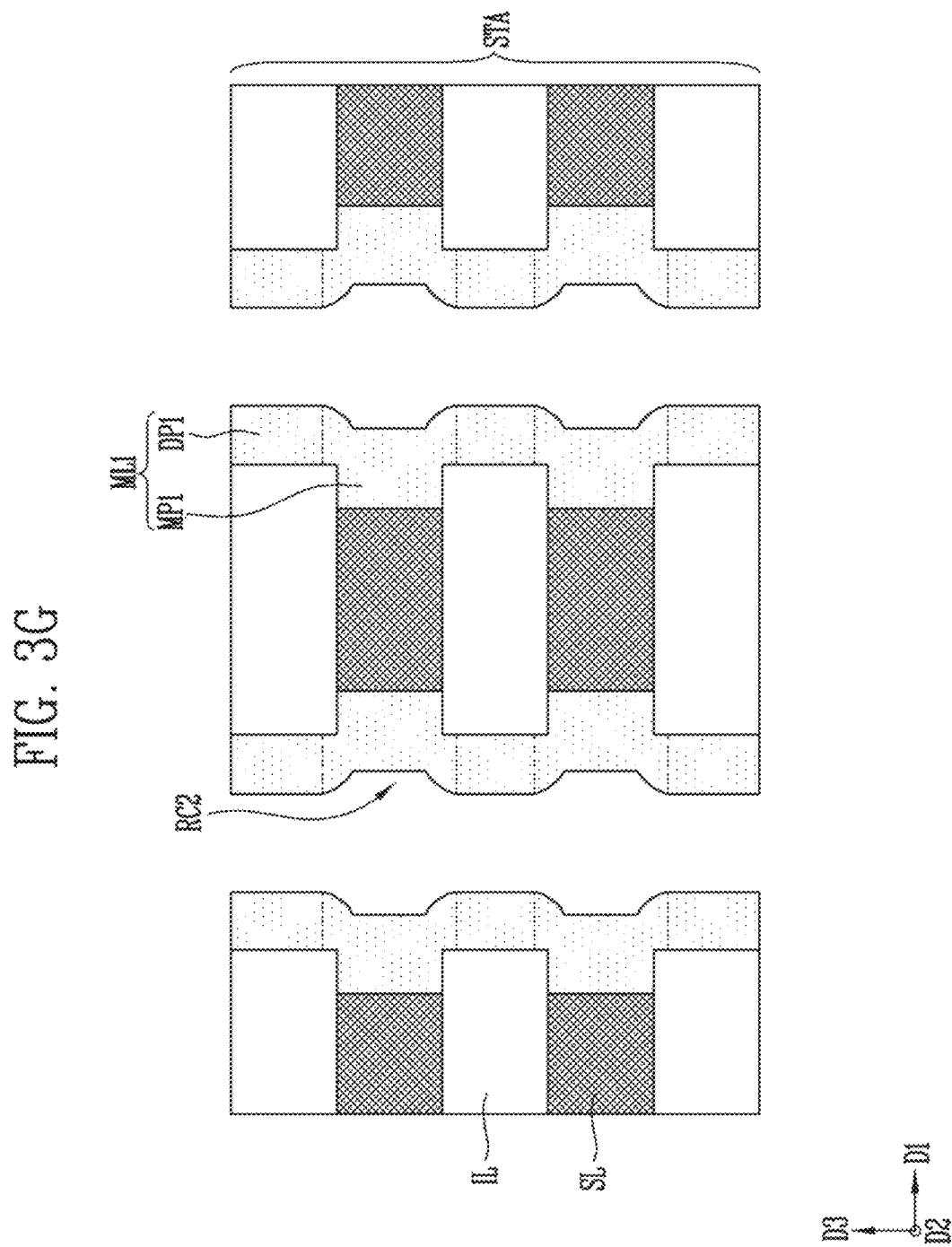

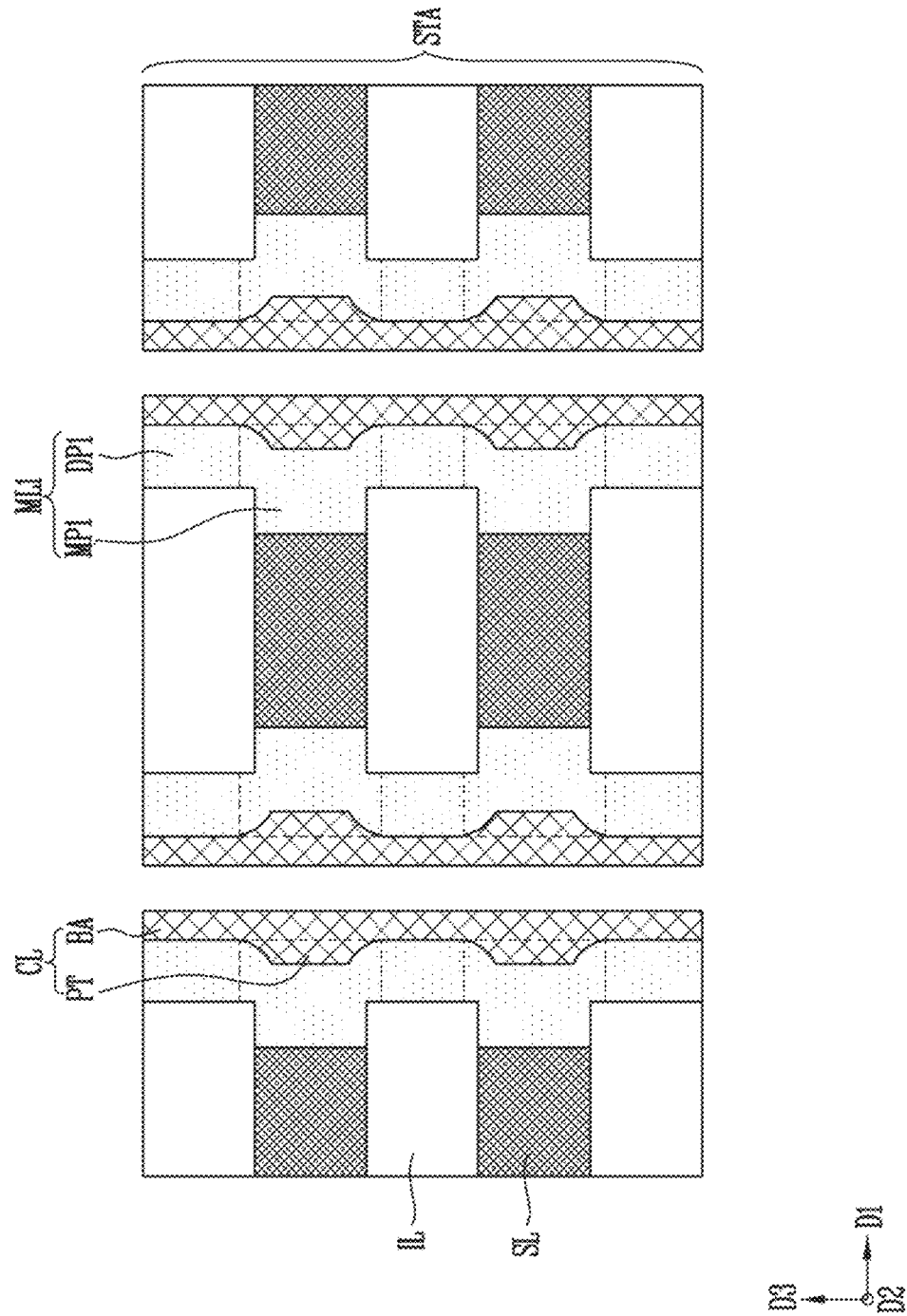

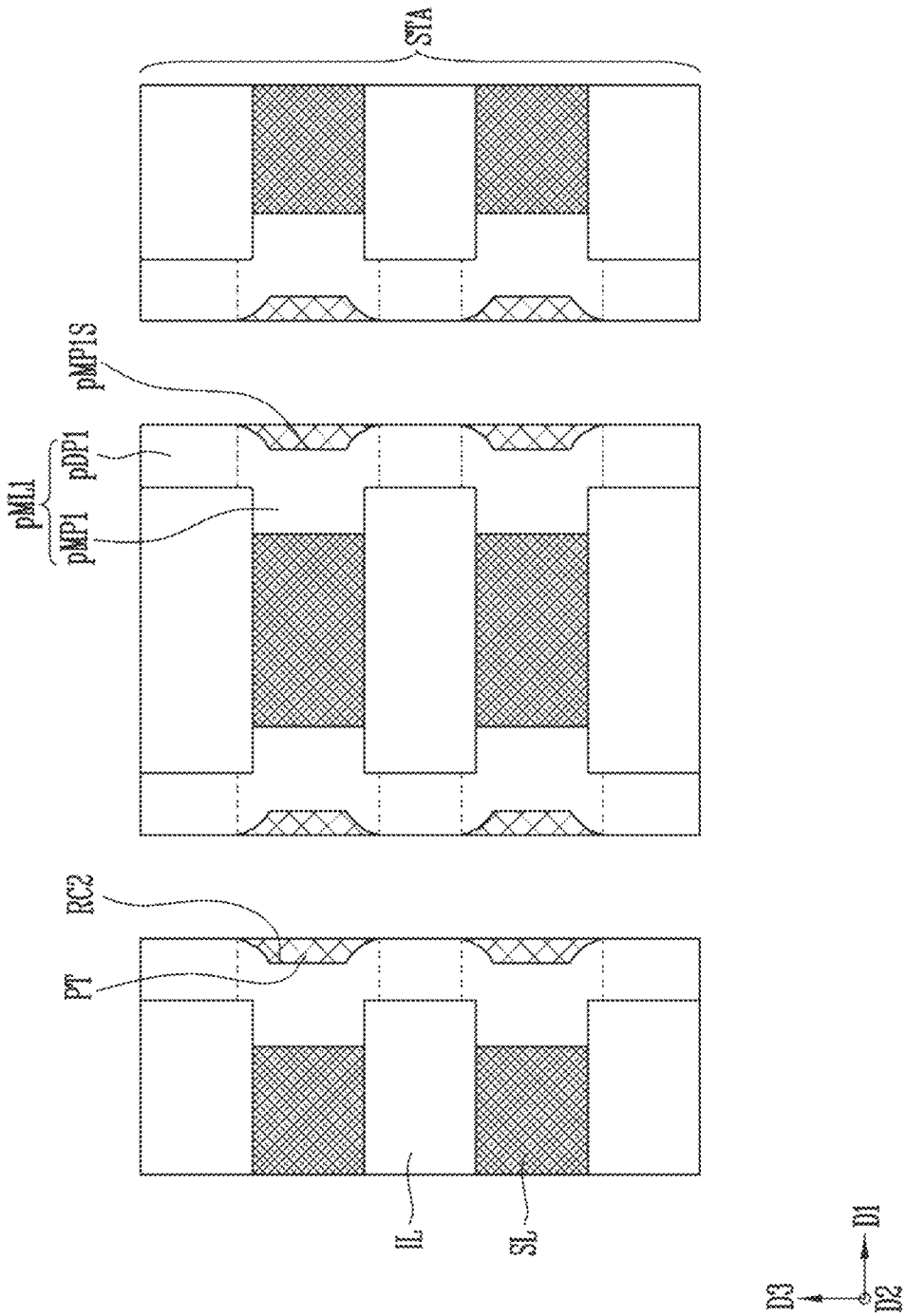

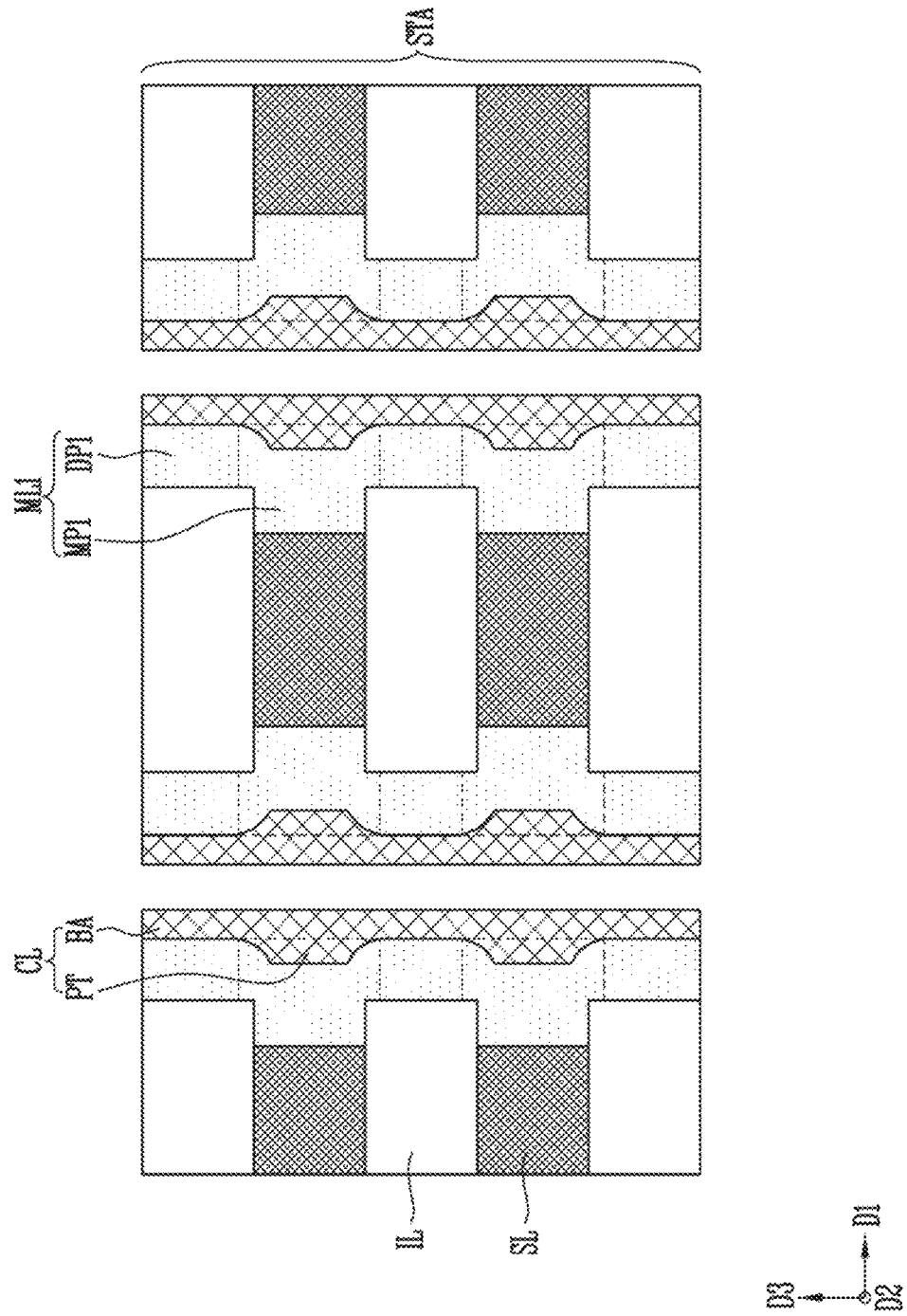

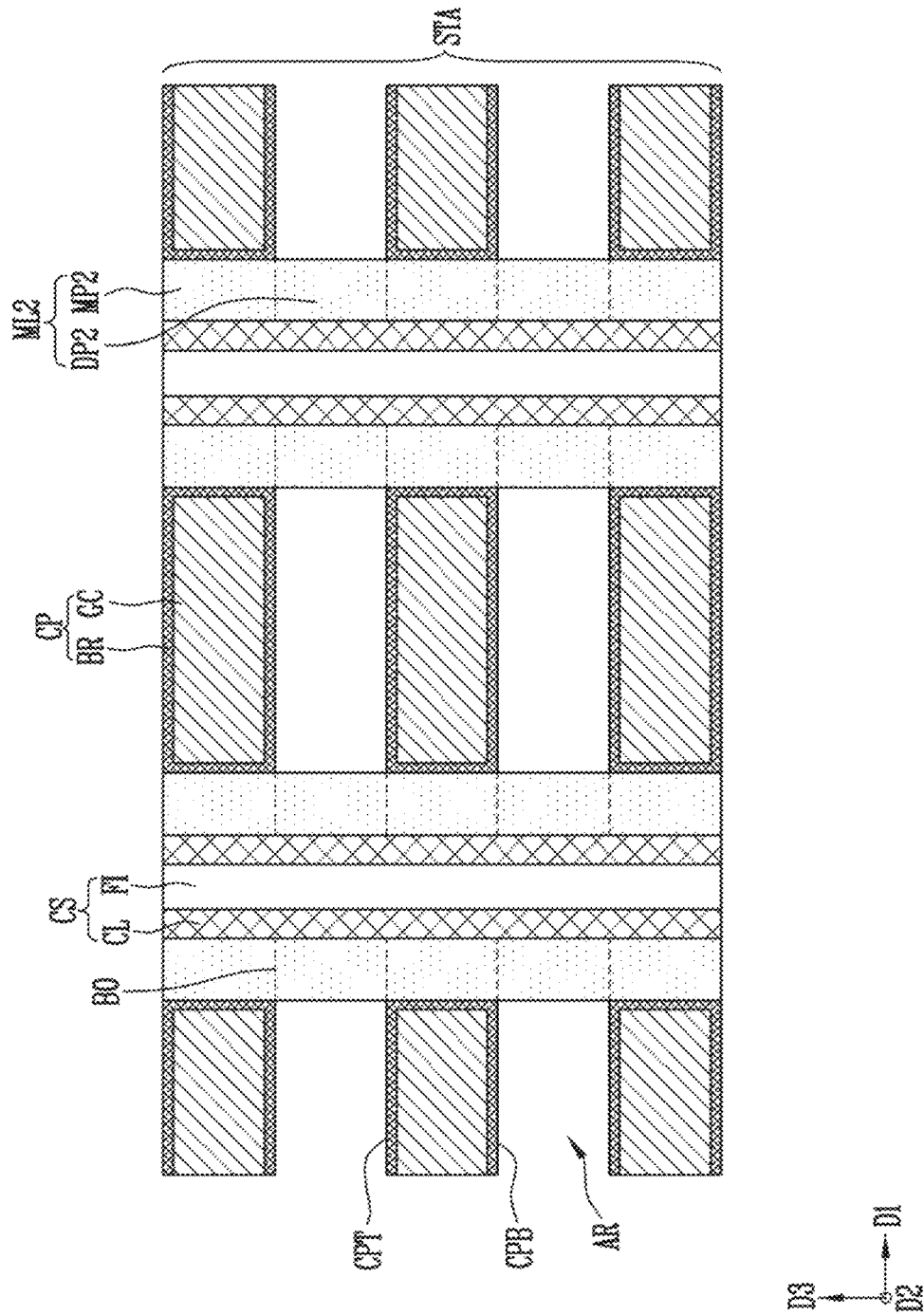

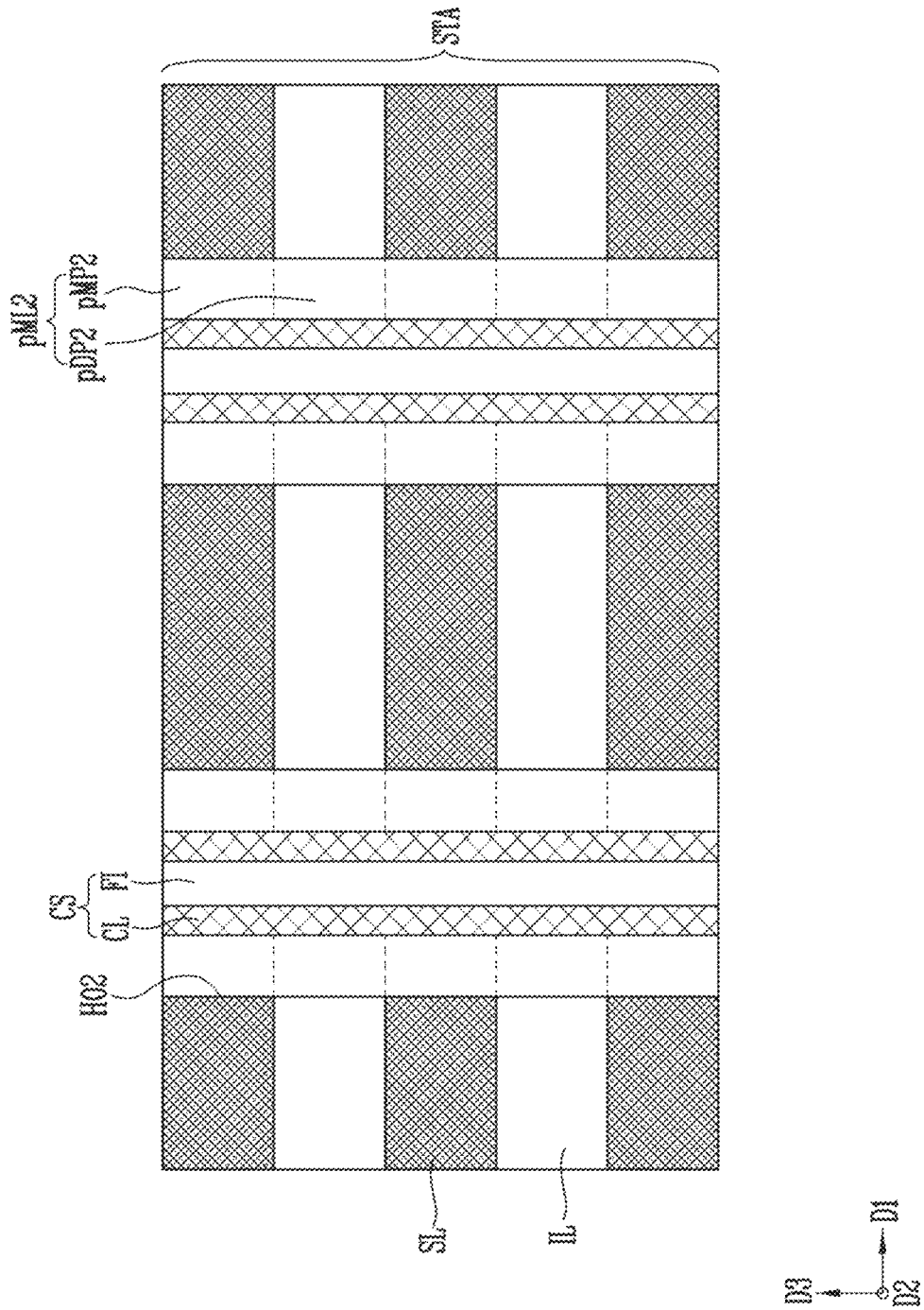

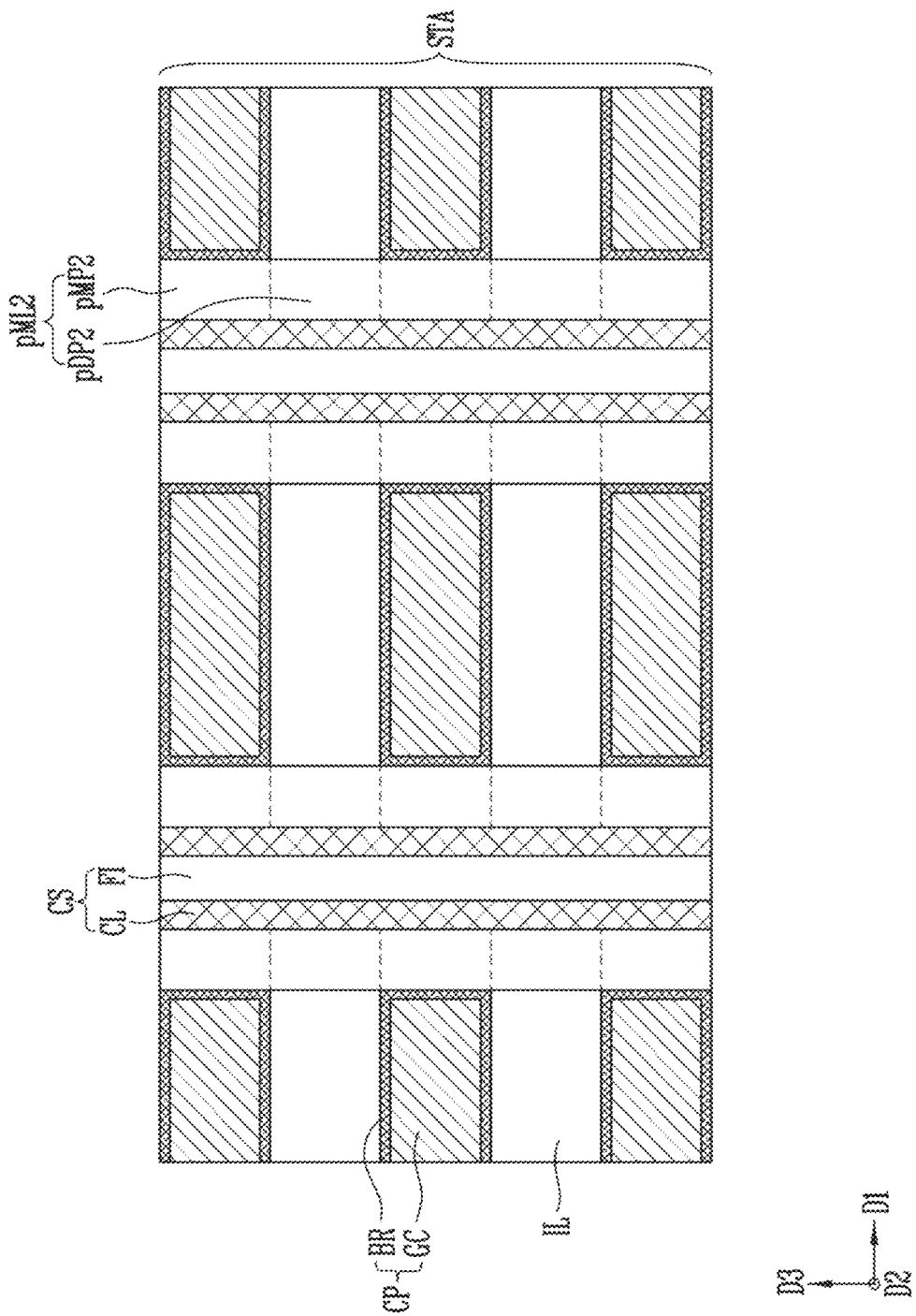

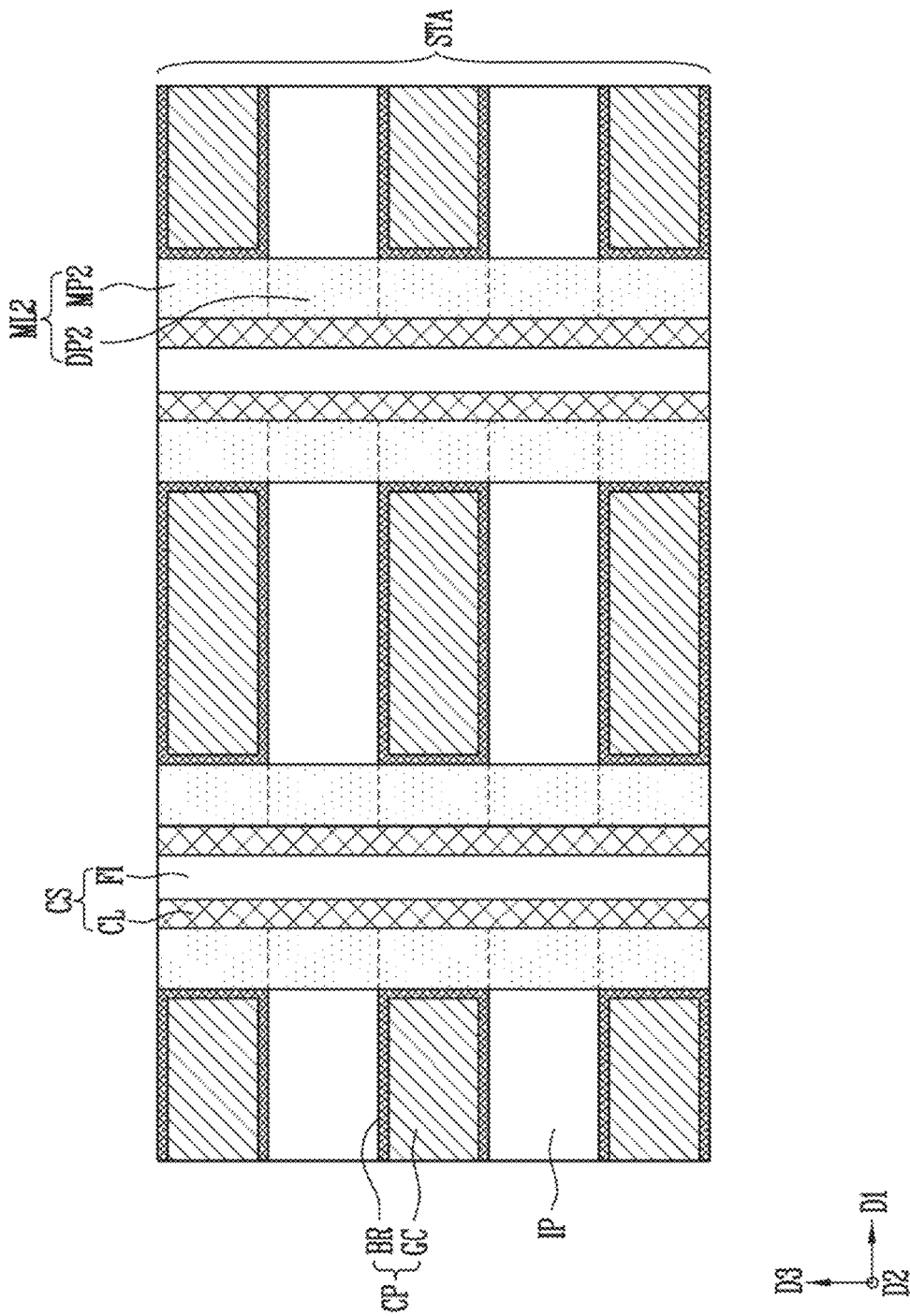

SEMICONDUCTOR DEVICE WITH FERROELECTRICITY

CROSS-REFERENCE TO RELATED APPLICATION

The present application claims priority under 35 U.S.C. § 119(a) to Korean patent application number 10-2020-0050932 filed on Apr. 27, 2020, in the Korean Intellectual Property Office, the entire disclosure of which is incorporated by reference herein.

BACKGROUND

1. Technical Field

The present disclosure generally relates to a semiconductor device and a manufacturing method of the semiconductor device, and more particularly, to a three-dimensional semiconductor device and a manufacturing method of the three-dimensional semiconductor device.

2. Related Art

A semiconductor device includes an integrated circuit configured with a Metal Oxide Semiconductor Field Effect Transistor (MOSFET). As the size and design rule of the semiconductor device are gradually reduced, scaling down of MOSFETs is gradually accelerated.

The scaling down of the MOSFETs may cause a short channel effect, etc., and therefore, operational characteristics of the semiconductor device may be deteriorated. Accordingly, there have been researched various methods for forming a semiconductor device having greater performance while overcoming a limitation due to high integration of the semiconductor device.

Further, such an integration circuit pursues operational reliability and low power consumption. Thus, there has been researched a method for forming a device which has higher reliability and lower power consumption in a smaller space.

SUMMARY

In accordance with an aspect of the present disclosure, there is provided a semiconductor device which may include: a stack structure including conductive patterns and insulating layers, which are alternately stacked; a channel structure penetrating the stack structure; and a memory layer penetrating the stack structure, the memory layer being disposed between the channel structure and the stack structure, wherein the memory layer includes memory parts and dummy parts, which are alternately arranged, wherein each of the memory parts includes a first part between the insulating layers and a second part between the dummy parts, and wherein the first part of the memory parts have ferroelectricity.

In accordance with another aspect of the present disclosure, there is provided a semiconductor device which may include: a stack structure including conductive patterns and insulating layers, which are alternately stacked; a channel structure penetrating the stack structure; and a memory layer penetrating the stack structure, the memory layer being disposed between the channel structure and the stack structure, wherein the memory layer includes memory parts and the dummy parts, which are alternately arranged, wherein each of the memory parts includes a first part between the insulating layers and a second part between the dummy parts, wherein the memory parts have ferroelectricity, and the dummy parts have paraelectricity.

In accordance with still another aspect of the present disclosure, there is provided a method of manufacturing a semiconductor device, the method may include: forming a stack structure including an insulating layer and a sacrificial layer; forming a first hole penetrating the stack structure such that a first sidewall of the insulating layer and a second sidewall of the sacrificial layer are exposed; forming a first recess defining a third sidewall of the sacrificial layer by etching the second sidewall of the sacrificial layer; forming a preliminary memory layer defining a second recess along the first sidewall of the insulating layer and the third sidewall of the sacrificial layer; forming a buffer pattern in the second recess; forming a memory layer by crystalizing the preliminary memory layer; and forming a channel layer in the memory layer.

In accordance with still another aspect of the present disclosure, there is provided a semiconductor device which may include: a stack structure including a plurality of conductive patterns; a channel layer penetrating the stack structure; and a memory layer penetrating the stack structure, the memory layer being disposed between the channel layer and the stack structure, wherein air gaps are defined between the conductive patterns, wherein the memory layer includes memory parts between the conductive patterns and the channel layer and dummy parts between the air gaps and the channel layer, wherein the memory parts and the dummy parts have ferroelectricity, wherein a maximum residual polarization intensity of the memory parts is greater than that of the dummy parts.

In accordance with still another aspect of the present disclosure, there is provided a semiconductor device which may include: a stack structure including a plurality of conductive patterns; a channel layer penetrating the stack structure; and a memory layer penetrating the stack structure, the memory layer being disposed between the channel layer and the stack structure, wherein air gaps are defined between the conductive patterns, wherein the memory layer includes memory parts between the conductive patterns and the channel layer and dummy parts between the air gaps and the channel layer, wherein the memory parts have ferroelectricity, and the dummy parts have paraelectricity.

In accordance with still another aspect of the present disclosure, there is provided a method of manufacturing a semiconductor device, the method may include: forming a stack structure including an insulating layer and a sacrificial layer; forming a preliminary memory layer penetrating the stack structure, the preliminary memory layer including a preliminary memory part and a preliminary dummy part; forming a channel layer in the preliminary memory layer; forming an air gap exposing the preliminary dummy part by removing the insulating layer; and forming a memory layer by crystalizing the preliminary memory layer in a state in which the preliminary dummy part is exposed.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 3A, 3B, 3C, 3D, 3E, 3F, 3G, 3H, and 3I are sectional views illustrating a manufacturing method of the semiconductor device shown in FIGS. 2A and 2B.

FIGS. 4A, 4B, and 4C are sectional views illustrating a manufacturing method of the semiconductor device shown in FIGS. 2A and 2B.

FIG. 5 is a sectional view of a semiconductor device in accordance with an embodiment of the present disclosure.

FIGS. 6A, 6B, and 6C are sectional views illustrating a manufacturing method of the semiconductor device shown in FIG. 5.

FIG. 7 is a sectional view of a semiconductor device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device capable of improving operational reliability.

Figure 1A:
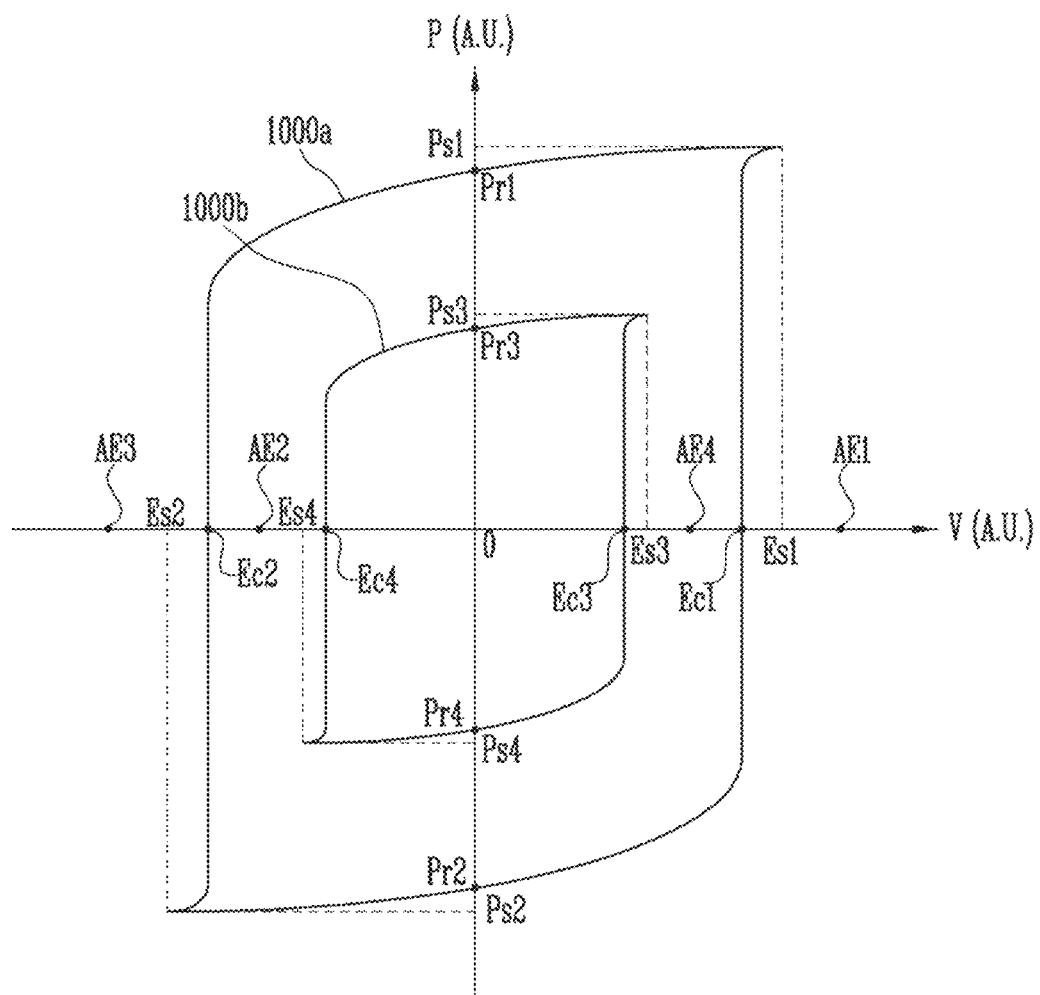
FIG. 1A is a hysteresis graph schematically illustrating electric field versus polarization characteristics of a ferroelectric layer in accordance with an embodiment of the present disclosure.

FIG. 1A is a hysteresis graph schematically illustrating electric field versus polarization characteristics of a ferroelectric layer in accordance with an embodiment of the present disclosure. FIGS. 1B to 1E are views of a ferroelectric device structure, illustrating the electric field versus polarization characteristics of the ferroelectric layer shown in FIG. 1A.

Figure 1B:
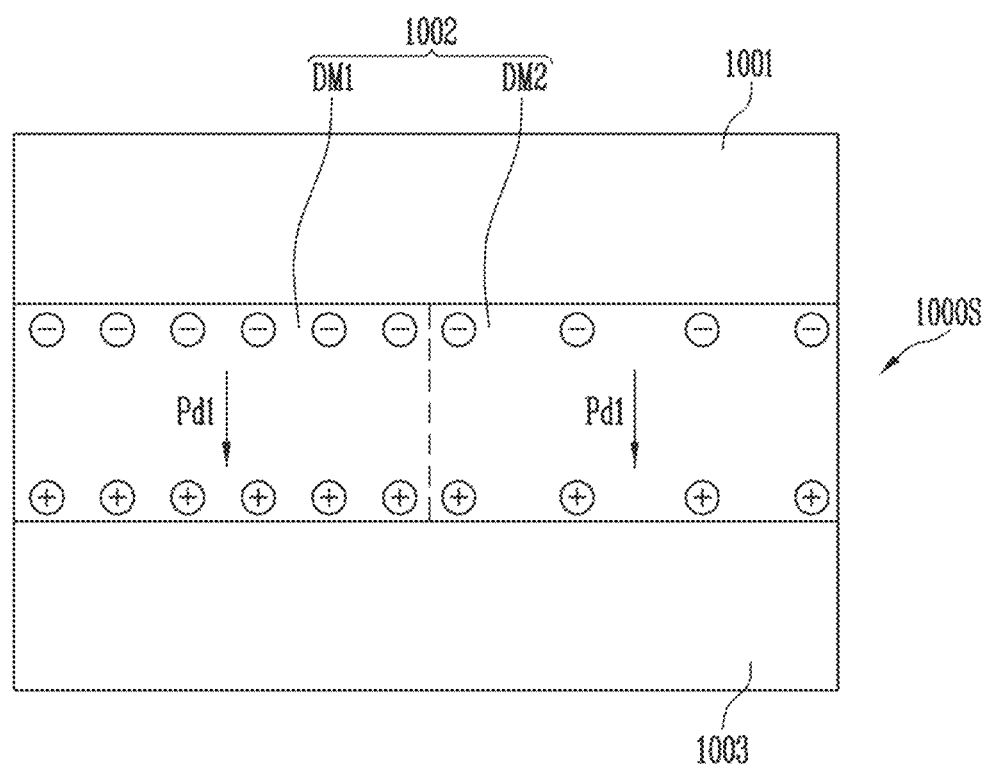
FIGS. 1B, 1C, 1D, and 1E are views of a ferroelectric device structure, illustrating the electric field versus polarization characteristics of the ferroelectric layer shown in FIG. 1A.

Referring to FIGS. 1A and 1B, the ferroelectric device structure 1000S may include a first electrode 1001, a ferroelectric layer 1002, and a second electrode 1003. The ferroelectric layer 1002 may include a material which may have ferroelectricity or paraelectricity according to a crystal structure. In an example, the ferroelectric layer 1002 may include hafnium zirconium oxide, hafnium oxide, or zirconium oxide. In an example, the ferroelectric layer 1002 may be doped with silicon, aluminum, yttrium or gadolinium as an impurity.

The ferroelectric layer 1002 may include a first domain DM1 and a second domain DM2. The first domain DM1 and the second domain DM2 may have the same composition. In an example, when the ferroelectric layer 1002 includes hafnium zirconium oxide, the first domain DM1 and the second domain DM2 may have a composition of $Hf_{1-x}Zr_xO_y$.

Each of the first and second domains DM1 and DM2 may include at least some of single crystals which have a crystal structure of an orthorhombic system and single crystals which do not have the crystal structure of the orthorhombic system. The single crystals which have the crystal structure of the orthorhombic system may be defined as first single crystals, and the single crystals which do not have the crystal structure of the orthorhombic system may be defined as second single crystals. In an example, the second single crystals may have a crystal structure of a monoclinic system.

An electric field versus polarization characteristic of each of the first and second domains DM1 and DM2 may be changed depending on a volume ratio occupied by the first single crystals in each of the first and second domains DM1 and DM2. The first and second domains DM1 and DM2 may have ferroelectricity or paraelectricity according to the volume ratio occupied by the first single crystals in each of the first and second domains DM1 and DM2.

In an example, when the volume ratio occupied by the first single crystals in the first domain DM1 is 100% and the volume ratio occupied by the first single crystals in the second domain DM2 is 0%, the first domain DM1 may have ferroelectricity, and the second domain DM2 may have paraelectricity.

In another example, when the volume ratio occupied by the first single crystals in the first domain DM1 is 70% and the volume ratio occupied by the first single crystals in the second domain DM2 is 30%, both the first domain DM1 and the second domain DM2 may have ferroelectricity, and the first domain DM1 may have ferroelectricity stronger than that of the second domain DM2.

As described above, although the first and second domains DM1 and DM2 have the same composition, electrical characteristics of the first and second domains DM1 and DM2 may be changed depending on the volume ratio occupied by the first single crystals in each of the first and second domains DM1 and DM2. Hereinafter, there will be described a case where both the first domain DM1 and the second domain DM2 have ferroelectricity, and the first domain DM1 has ferroelectricity stronger than that of the second domain DM2.

When an electric field is applied between the first and second electrodes 1001 and 1003 of the ferroelectric device structure 1000S, a polarization of each of the first and second domains DM1 and DM2 of the ferroelectric layer 1002 may have a characteristic in which the polarization follows a hysteresis graph 1000a or 1000b shown in FIG. 1A. The polarization of the first domain DM1 may have a characteristic in which the polarization follows a first hysteresis graph 1000a, and the polarization of the second domain DM2 may have a characteristic in which the polarization follows a second hysteresis graph 1000b.

The first hysteresis graph 1000a may represent a pair of first and second coercive electric fields Ec1 and Ec2 and a pair of first and second residual polarizations Pr1 and Pr2. The first residual polarization Pr1 may have a first polarization orientation Pd1, and the second residual polarization Pr2 may have a second polarization orientation Pd2 (see FIG. 1D) which is a direction opposite to the first polarization orientation Pd1. Also, the first hysteresis graph 1000a may represent a pair of first and second saturation polarizations Ps1 and Ps2 respectively in a pair of first and second saturation electric fields Es1 and Es2.

The second hysteresis graph 1000b may represent a pair of third and fourth coercive electric fields Ec3 and Ec4 and a pair of third and fourth residual polarizations Pr3 and Pr4. The third residual polarization Pr3 may have the first polarization orientation Pd1, and the fourth residual polarization Pr4 may have the second polarization orientation Pd2 (see FIG. 1D) which is a direction opposite to the first polarization orientation Pd1. Also, the second hysteresis graph 1000b may represent a pair of third and fourth saturation polarizations Ps1 and Ps4 respectively in a pair of third and fourth saturation electric fields Es3 and Es4.

Referring to FIGS. 1A and 1B, a first electric field AE1 may be generated in a direction from the first electrode 1001 to the second electrode 1003 by grounding the second electrode 1003 and applying a voltage having a positive polarity to the first electrode 1001. An absolute value of the first electric field AE1 may be equal to or greater than that of the first saturation electric field Es1. The first domain DM1 may have the first saturation polarization Ps1, and the second domain DM2 may have the third saturation polarization Ps3. Subsequently, when the first electric field AE1 is removed, the first domain DM1 may have the first residual polarization Pr1 having the first polarization orientation Pd1 as shown in FIG. 1B, and the second domain DM2 may have the third residual polarization Pr3 having the first polarization orientation Pd1 as shown in FIG. 1B.

Figure 1C:
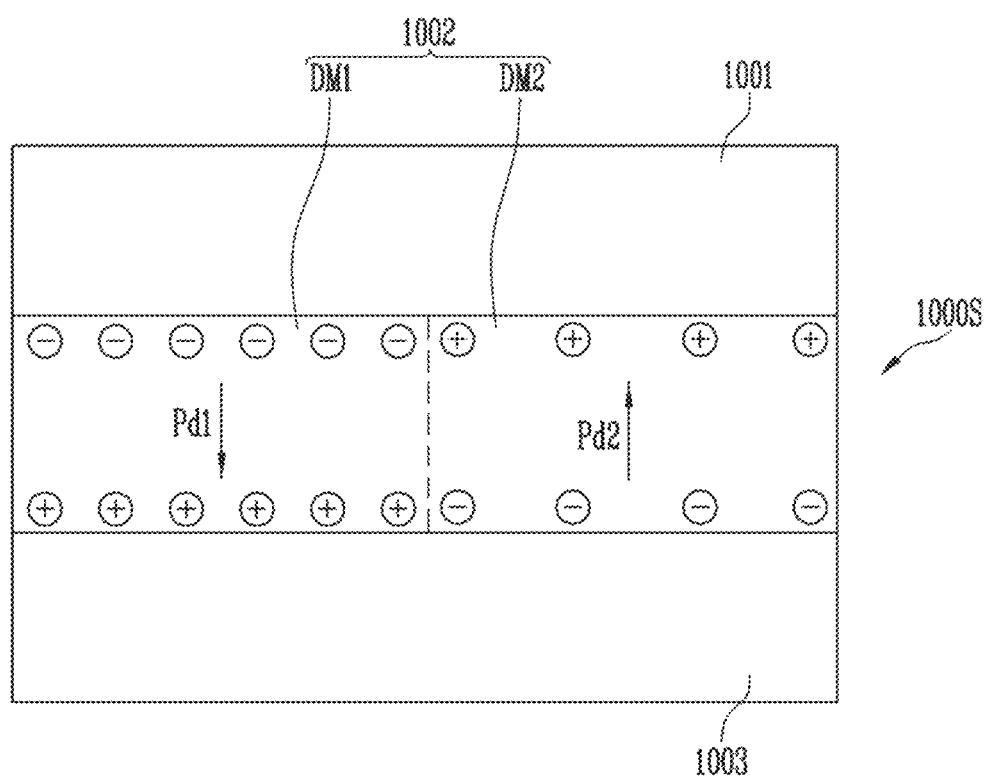

Referring to FIGS. 1A and 1C, in the state in which the first domain DM1 has the first residual polarization Pr1 having the first polarization orientation Pd1 and the second domain DM2 has the third residual polarization Pr3 having the first polarization orientation Pd1, a second electric field AE2 may be generated in a direction from the second electrode 1003 to the first electrode 1001 by grounding the second electrode 1003 and applying a voltage having a negative polarity to the first electrode 1001. An absolute value of the second electric field AE2 may be equal to or greater than that of the fourth saturation electric field Es4 of the second domain DM2 and be less than that of the second coercive electric field Ec2 of the first domain DM1. The polarization direction of the first domain DM1 might not be changed, and the second domain DM2 may have the fourth saturation polarization Ps4. Subsequently, when the second electric field AE2 is removed, the first domain DM1 may have a residual polarization having the first polarization orientation Pd1 as shown in FIG. 1C, and the second domain DM2 may have the fourth residual polarization Pr4 having the second polarization orientation Pd2 as shown in FIG. 1C.

Figure 1D:
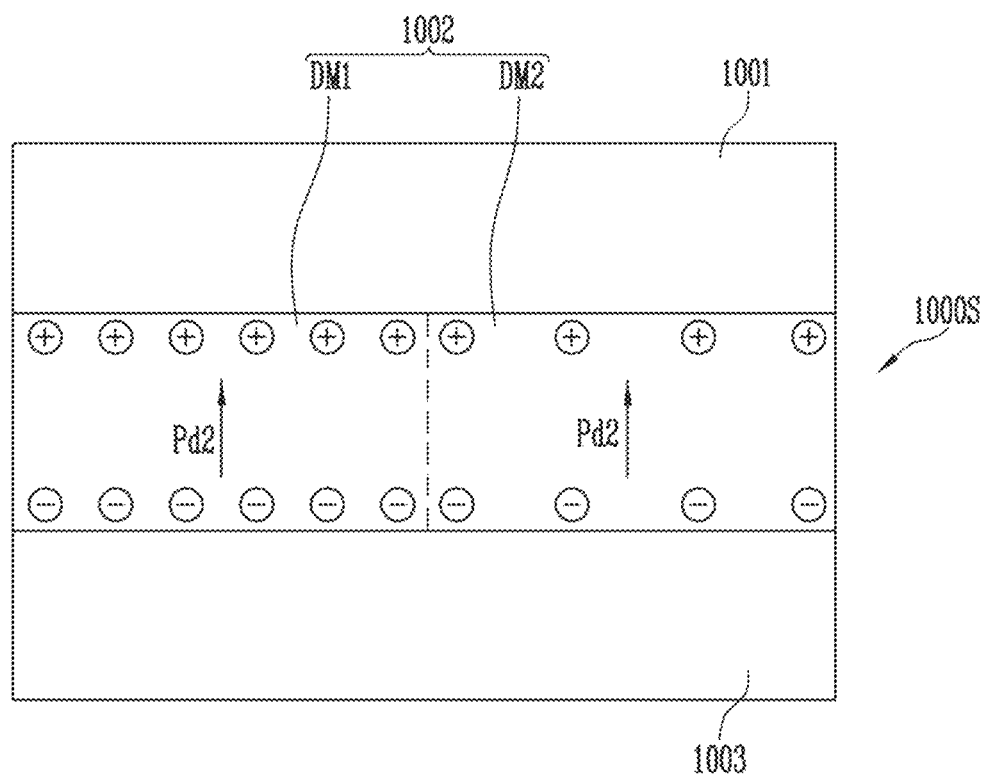

Referring to FIGS. 1A and 1D, in the state in which the first domain DM1 has the residual polarization having the first polarization orientation Pd1 and the second domain DM2 has the fourth residual polarization Pr4 having the second polarization orientation Pd2, a third electric field AE3 may be generated in the direction from the second electrode 1003 to the first electrode 1001 by grounding the second electrode 1003 and applying a voltage having a negative polarity to the first electrode 1001. An absolute value of the third electric field AE3 may be equal to or greater than that of the second saturation electric field Es2 of the first domain DM1. The first domain DM1 may have the second saturation polarization Ps2, and the second domain DM2 may have the fourth saturation polarization Ps4. Subsequently, when the third electric field AE3 is removed, the first domain DM1 may have the second residual polarization Pr2 having the second polarization orientation Pd2 as shown in FIG. 1D, and the second domain DM2 may have the fourth residual polarization Pr4 having the second polarization orientation Pd2 as shown in FIG. 1D.

Figure 1E:
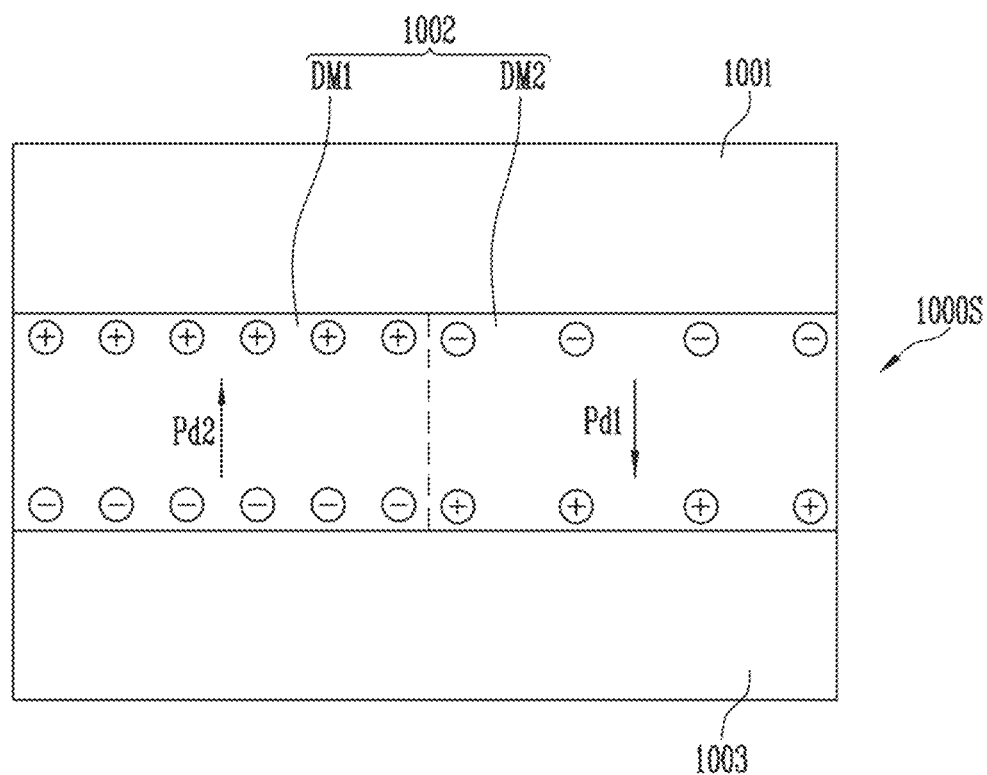

Referring to FIGS. 1A and 1E, in the state in which the first domain DM1 has the second residual polarization Pr2 having the second polarization orientation Pd2 and the second domain DM2 has the fourth residual polarization Pr4 having the second polarization orientation Pd2, a fourth electric field AE4 may be generated in the direction from the first electrode 1001 to the second electrode 1003 by grounding the second electrode 1003 and applying a voltage having a positive polarity to the first electrode 1001. An absolute value of the fourth electric field AE4 may be equal to or greater than that of the third saturation electric field Es3 of the second domain DM2 and be less than that of the first coercive electric field Ec1 of the first domain DM1. The polarization direction of the first domain DM1 might not be changed, and the second domain DM2 may have the third saturation polarization Ps1. Subsequently, when the fourth electric field AE4 is removed, the first domain DM1 may have a residual polarization having the second polarization orientation Pd2 as shown in FIG. 1E, and the second domain DM2 may have the third residual polarization Pr3 having the first polarization orientation Pd1 as shown in FIG. 1E.

As described above, the directions of residual polarizations of the first and second domains DM1 and DM2 of the ferroelectric layer 10002 may be controlled according to the directions and magnitudes of the electric fields AE1, AE2, AE3, and AE4 applied to the first and second domains DM1 and DM2.

Since the first domain DM1 has ferroelectricity stronger than that of the second domain DM2, the hysteresis graph 1000a of the first domain DM1 and the hysteresis graph 1000b of the second domain DM2 may be different from each other.

The first domain DM1 may have a maximum residual polarization intensity when the first domain DM1 has the first residual polarization Pr1 or the second residual polarization Pr2. The second domain DM2 may have a maximum residual polarization intensity when the second domain DM2 has the third residual polarization Pr3 or the fourth residual polarization Pr4. Since the first domain DM1 has ferroelectricity stronger than that of the second domain DM2, the maximum residual polarization intensity of the first domain DM1 may be greater than that of the second domain DM2.

Since the first domain DM1 has ferroelectricity stronger than that of the second domain DM2, the absolute values of the first and second coercive electric fields Ec1 and Ec2 of the first domain DM1 may be greater than those of the third and fourth coercive electric fields Ec3 and Ec4 of the second domain DM2.

Figure 2A:
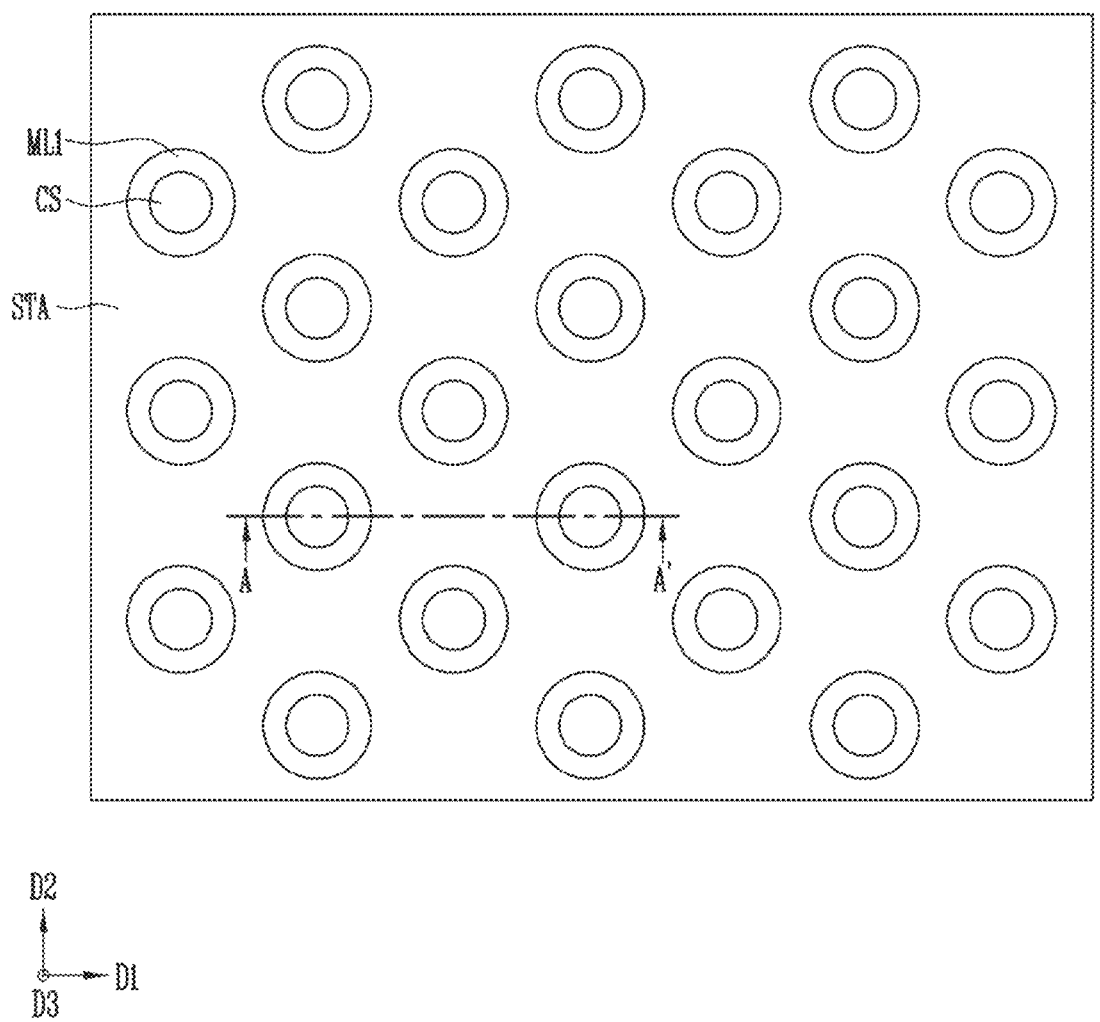
FIG. 2A is a plan view of a semiconductor device in accordance with an embodiment of the present disclosure.
Figure 2B:
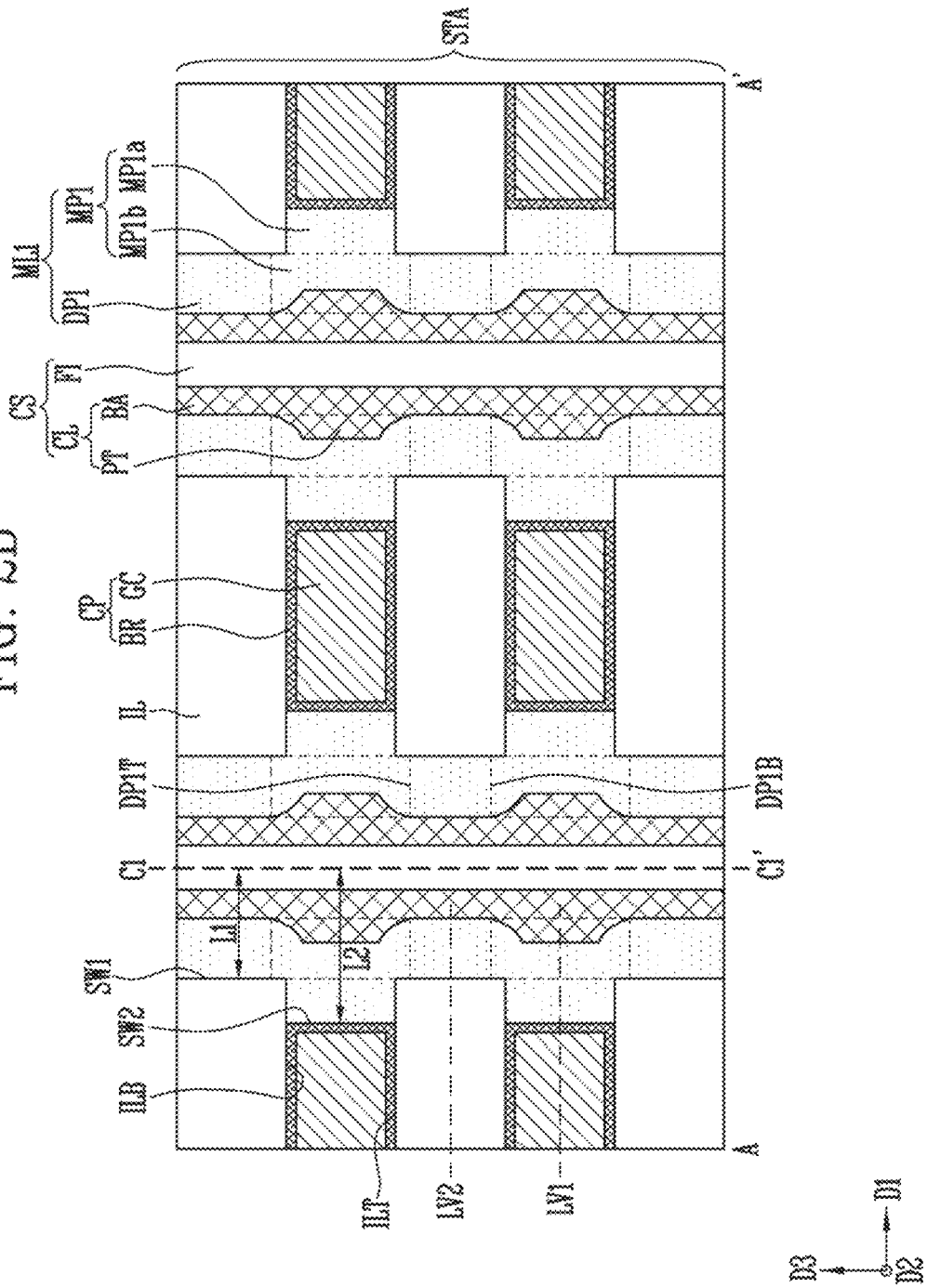
FIG. 2B is a sectional view taken along line A-A' shown in FIG. 2A.

FIG. 2A is a plan view of a semiconductor device in accordance with an embodiment of the present disclosure. FIG. 2B is a sectional view taken along line A-A' shown in FIG. 2A.

Referring to FIGS. 2A and 2B, the semiconductor device in accordance with these embodiments may include a stack structure STA including insulating layers IL and conductive patterns CP.

The stack structure STA may be formed on a substrate (not shown). The substrate may physically support the stack structure STA. In an example, the substrate may be a semiconductor substrate or an insulator substrate. The substrate may have the shape of a plate expanding along a plane defined by a first direction D1 and a second direction D2. The first direction D1 and the second direction D2 may intersect each other. In an example, the first direction D1 and the second direction D2 may be orthogonal to each other.

In an embodiment, a peripheral circuit structure (not shown) may be provided between the stack structure STA and the substrate. The peripheral circuit structure may include transistors and lines.

The conductive patterns CP and the insulating layers IL of the stack structure STA may be alternately stacked. In other words, the conductive patterns CP and the insulating layers IL of the stack structure STA may be alternately arranged in a third direction D3. The third direction D3 may intersect the first direction D1 and the second direction D2. In an example, the third direction D3 may be orthogonal to the first direction D1 and the second direction D2.

The insulating layers IL may include an insulating material. In an example, the insulating layers IL may include oxide.

Each of the conductive patterns CP may include a gate conductive layer GC and a barrier layer BR. The barrier layer BR may surround a surface of the gate conductive layer GC. In an example, the gate conductive layer GC may include at least one of a doped semiconductor material, metal silicide, tungsten, nickel, and cobalt. In an example, the barrier layer BR may include at least one of titanium nitride and tantalum nitride. The conductive pattern CP may be used as a word line.

A channel structure CS and a first memory layer ML1 may be provided, which penetrate the stack structure STA. The channel structure CS and the first memory layer ML1 may extend in the third direction D3 and penetrate the stack structure STA. The channel structure CS and the first memory layer ML1 may penetrate the conductive patterns CP and the insulating layers IL of the stack structure STA. The first memory layer ML1 may be disposed between the channel structure CS and the stack structure STA.

The channel structure CS may include a channel layer CL and a filling layer FI in the channel layer CL. The channel layer CL and the filling layer FI may extend in the third direction D3. The channel layer CL may surround the filling layer FI. The channel layer CL may be electrically connected to a bit line and a source line. The channel layer CL may include a semiconductor material. In an example, the channel layer CL may include poly-silicon. The filling layer FI may include an insulating material. In an example, the filling layer FI may include oxide.

A central line of the channel structure CS may be defined as a first central line C1-C1'. In an example, the central line of the channel structure CS is a line located in the middle of the channel structure be equal distance from the circumference of the filling layer. The first central line C1-C1' of the channel structure CS may extend in the third direction D3. The first central line C1-C1' of the channel structure CS may extend in a direction in which the channel structure CS extends. The first central line C1-C1' of the channel structure CS may be located in the filling layer FI. The first central line C1-C1' of the channel structure CS may be a virtual line connecting centers of the channel structure CS in the first direction D1.

The insulating layer IL may include a first sidewall SW1. The first sidewall SW1 may be in contact with the first memory layer ML1. A portion of a bottom surface ILB of the insulating layer IL may be in contact with the first memory layer ML1. A portion of a top surface ILT of the insulating layer IL may be in contact with the first memory layer ML1. The conductive pattern CP may include a second sidewall SW2. The second sidewall SW2 may be in contact with the first memory layer ML1.

A shortest distance between the first sidewall SW1 and the first central line C1-C1' may be defined as a first distance L1. A shortest distance between the second sidewall SW2 and the first central line C1-C1' may be defined as a second distance L2. The first distance L1 may be smaller than the second distance L2. A shortest distance between the insulating layer IL and the first central line C1-C1' may be equal to the first distance L1. A shortest distance between the conductive pattern CP and the first central line C1-C1' may be equal to the second distance L2.

A shortest distance between the first sidewall SW1 and the filling layer FI may be smaller than that between the second sidewall SW2 and the filling layer FI. A shortest distance between the insulating layer IL and the filling layer FI may be smaller than that between the conductive pattern CP and the filling layer FI.

The first memory layer ML1 may include first memory parts MP1 and first dummy parts DP1. The first memory parts MP1 and the first dummy parts DP1 may be alternately arranged in the third direction D3. The first memory part MP1 may be disposed between the channel structure CS and the conductive pattern CP. The first dummy part DP1 may be disposed between the channel structure CS and the insulating layer IL.

Central levels of the first memory part MP1 and the conductive pattern CP, which are in contact with each other, may be the same. In an example, the central levels of the first memory part MP1 and the conductive pattern CP, which are in contact with each other, may be a first level LV1. Central levels of the first dummy part DP1 and the insulating layer IL, which are in contact with each other, may be the same. In an example, the central levels of the first dummy part DP1 and the insulating layer IL, which are in contact with each other, may be a second level LV2. The central level may mean a level of the middle of an uppermost portion and a lowermost portion. In an example, the central level of the conductive pattern CP may mean a level of the middle of an uppermost portion and a lowermost portion of the conductive pattern CP.

The first memory part MP1 may include a first part MP1*a* between the insulating layers IL and a second part MP1*b* between the first dummy parts DP1. The first part MP1*a* may in contact with a conductive pattern CP and insulating layers IL on the top and bottom of the conductive pattern CP. The first part MP1*a* may be in contact with the second sidewall SW2 of the conductive pattern CP, the bottom surface ILB of the insulating layer IL, which is in contact with a top surface of the conductive pattern CP, and the top surface ILT of the insulating layer IL, which is in contact with a bottom surface of the conductive pattern CP. The first part MP1*a* may be spaced apart from the first dummy part DP1.

The second part MP1*b* may be in contact with the first dummy parts DP1. The first part MP1*a* may surround the second part MP1*b*. The first part MP1*a* may be spaced apart from the channel structure CS by the second part MP1*b*. The second part MP1*b* may be disposed between the first part MP1*a* and the channel structure CS.

The first dummy part DP1 may be in contact with the insulating layer IL. The first dummy part DP1 may be in contact with the first sidewall SW1 of the insulating layer IL. The first dummy part DP1 may be disposed between the first memory parts MP1. The first dummy part DP1 may be in contact with the second parts MP1*b* of the first memory parts MP1. The second parts MP1b may be in contact with a top surface DP1T and a bottom surface DP1B of the first dummy part DP1.

In an example, the first memory part MP1 and the first dummy part DP1 may include hafnium zirconium oxide, hafnium oxide, or zirconium oxide. In an example, the first memory part MP1 and the first dummy part DP1 may be doped with silicon, aluminum, yttrium or gadolinium as an impurity.

The first memory part MP1 and the first dummy part DP1 may have the same composition. In an example, when the first memory part MP1 and the first dummy part DP1 include hafnium zirconium oxide, the first memory part MP1 and the first dummy part DP1 may have a composition of $Hf_{1-x}Zr_xO_y$.

A volume ratio occupied by single crystals having a crystal structure of an orthorhombic system at the first memory part MP1 may be greater than that occupied by single crystals having the crystal structure of the orthorhombic system at the first dummy part DP1. The volume ratio occupied by the single crystals having the crystal structure of the orthorhombic system at the first memory part MP1 may be defined as a first volume ratio, and the volume ration occupied by the single crystals having the crystal structure of the orthorhombic system at the first dummy part DP1 may be defined as a second volume ratio.

In an example, both the first memory part MP1 and the first dummy part DP1 may include single crystals having the crystal structure of the orthorhombic system, and the first volume ratio may be greater than the second volume ratio. Both the first memory part MP1 and the first dummy part DP1 may have ferroelectricity, and the first memory part MP1 may have ferroelectricity stronger than that of the first dummy part DP1. Since the first memory part MP1 has ferroelectricity stronger than that of the first dummy part DP1, a maximum residual polarization intensity of the first memory part MP1 may be greater than that of the first dummy part DP1. Since the first memory part MP1 has ferroelectricity stronger than that of the first dummy part DP1, an absolute value of a coercive electric field of the first memory part MP1 may be greater than that of a coercive electric field of the first dummy part DP1. Since the first memory part MP1 has ferroelectricity stronger than that of the first dummy part DP1, a hysteresis graph of the first memory part MP1 and a hysteresis graph of the first dummy part DP1 may be different from each other.

In an example, the first memory part MP1 may include single crystals having the crystal structure of the orthorhombic system, and the first dummy part DP1 might not include the single crystals having the crystal structure of the orthorhombic system. The first memory part MP1 may have ferroelectricity, and the first dummy part DP1 may have paraelectricity.

The channel layer CL may include a base part BA and protrusion parts PT. The base part BA may be in contact with an outer wall of the filling layer FI. The base part BA may extend in the third direction D3 and penetrate the stack structure STA.

The protrusion parts PT may protrude toward the conductive patterns CP on an outer wall of the base part BA. The protrusion parts PT may protrude toward the first memory part MP1 of the first memory layer ML1. A shortest distance between the protrusion part PT and the conductive pattern CP may be smaller than that between the base part BA and the conductive pattern CP. A shortest distance between the protrusion part PT and the first part MP1a of the first memory part MP1 may be smaller than that between the base part BA and the insulating layer IL. The protrusion part PT may surround the base part BA. The protrusion part PT may be disposed between the first dummy parts DP1. The first dummy part DP1 may be disposed between the protrusion parts PT. The protrusion part PT may be in contact with the second part MP1b of the first memory part MP1. The protrusion parts PT may be spaced apart from each other in the third direction D3. Central levels of the protrusion part PT and the first memory part MP1 of the first memory layer ML1, which are in contact with each other, may be the same. Central levels of the protrusion part PT, the first memory part MP1 of the first memory layer ML1, and the conductive pattern CP, which are connected to each other, may be the same.

In the semiconductor device in accordance with these embodiments, the first memory part MP1 having ferroelectricity may be polarized by applying a voltage to a word line.

In the semiconductor device in accordance with these embodiments, the first memory part MP1 may have ferroelectricity and the first dummy part DP1 may have paraelectricity. Alternatively, both the first memory part MP1 and the first dummy part DP1 may have ferroelectricity, and the first memory part MP1 may have ferroelectricity stronger than that of the first dummy part DP1.

Thus, the first dummy part DP1 is not polarized or may be relatively weakly polarized, even when a voltage is applied to a word line so as to polarize the memory part MP1. Accordingly, disturbance and interference, which are caused by polarization of the first dummy part DP1, can be minimized.

FIGS. 3A to 3I are sectional views illustrating a manufacturing method of the semiconductor device shown in FIGS. 2A and 2B.

For convenience of description, components identical to those described with reference to FIGS. 2A and 2B are designated by like reference numerals, and overlapping descriptions will be omitted.

The manufacturing method described below is merely an embodiment of a method of manufacturing the semiconductor memory device shown in FIGS. 2A and 2B, and the method of manufacturing the semiconductor memory device shown in FIGS. 2A and 2B might not be limited to the manufacturing method described below.

Referring to FIG. 3A, a stack structure STA may be formed, which includes sacrificial layers SL and insulating layers IL. The sacrificial layers SL and the insulating layers IL may be alternately stacked. The sacrificial layers SL and the insulating layers IL may include different materials. In an example, the sacrificial layers SL may include nitride, and the insulating layers IL may include oxide.

Referring to FIG. 3B, first holes HO1 may be formed, which penetrate the stack structure STA. The first holes HO1 may be formed by using a photolithography process. The first holes HO1 may extend in a third direction D3. The first holes HO1 may penetrate the insulating layers IL and the sacrificial layers SL of the stack structure STA.

When the first hole HO1 is formed, first sidewalls SW1 of the insulating layers IL may be exposed. When the first hole HO1 is formed, third sidewalls SW3 of the sacrificial layers SL may be exposed. The first sidewalls SW1 and the third sidewalls SW3 may form a common surface.

Figure 3C:
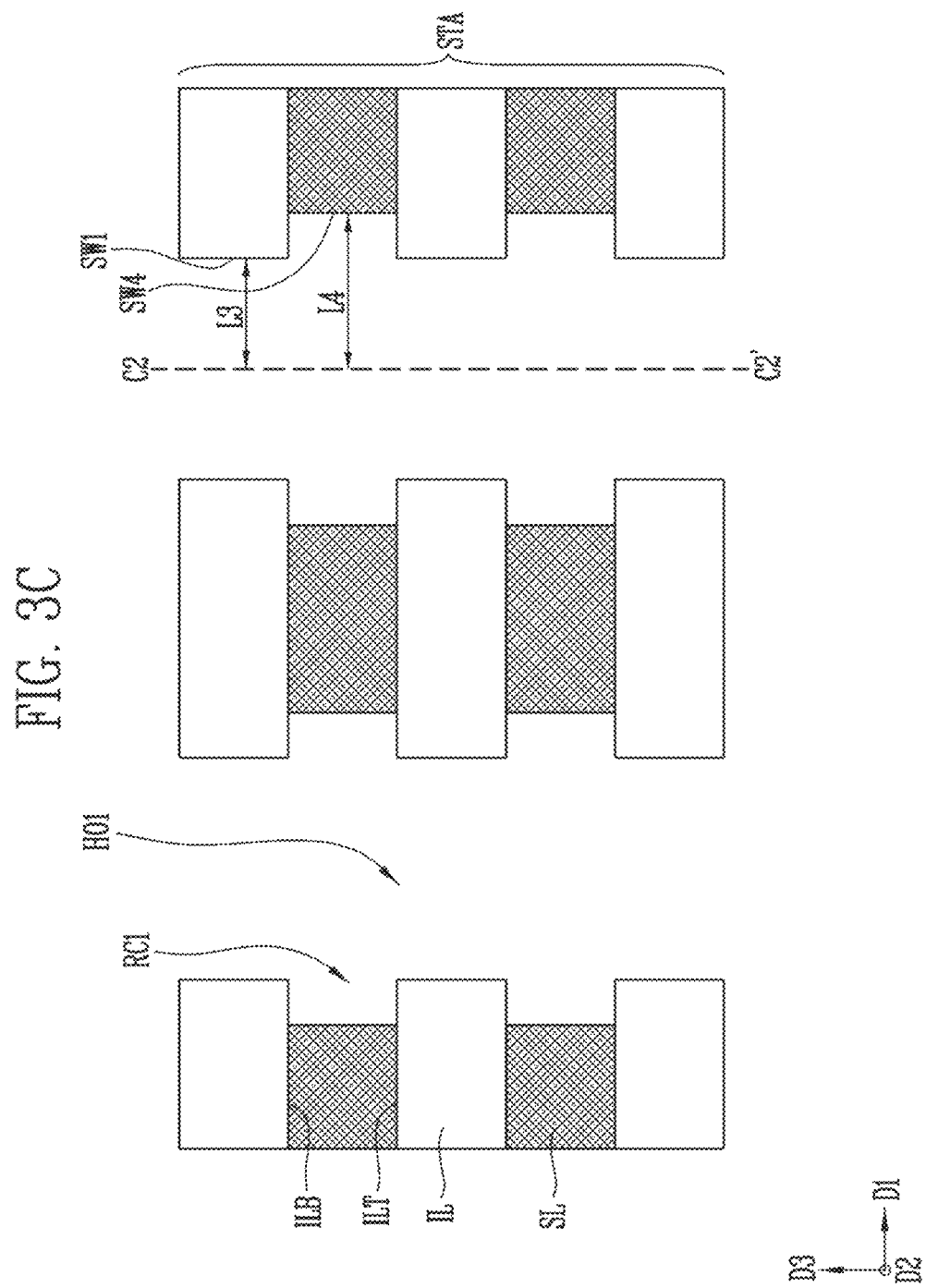

Referring to FIG. 3C, the sacrificial layers SL exposed by the first hole HO1 may be selectively etched. A portion of each of the sacrificial layers SL may be selectively removed. The third sidewalls SW3 of the sacrificial layers SL may be selectively etched. The sidewalls of the sacrificial layers SL, which are exposed by selectively etching the sacrificial layers SL, may be defined as fourth sidewalls SW4.

When the sacrificial layers SL are selectively etched, a portion of a top surface ILT of each of the insulating layer IL and a portion of a bottom surface ILB of each of the insulating layer IL may be exposed. When the sacrificial layers SL are selectively etched, first recesses RC1 may be formed. The first recesses RC1 may be connected to the first hole HO1. The first recesses RC1 may surround the first hole HO1. The first recesses RC1 may be defined by the fourth sidewalk SW4 of the sacrificial layers SL and the top surfaces ILT and the bottom surfaces ILB of the insulating layers IL. The fourth sidewalls SW4 of the sacrificial layers SL may be exposed through the first recesses RC1. The first recesses RC1 may be spaced apart from each other in the third direction D3.

A central line of the first hole HO1 may be defined as a second central line C2-C2'. The second central line C2-C2' of the first hole HO1 may extend in the third direction D3. The second central line C2-C2' of the first hole HO1 may extend in a direction in which the first hole HO1 extends. The second central line C2-C2' of the first hole HO1 may be a virtual line connecting centers of the first hole HO1 in a first direction D1.

A shortest distance between the first sidewall SW1 and the second central line C2-C2' may be defined as a third distance L3. A shortest distance between the fourth sidewall SW4 and the second central line C2-C2' may be defined as a fourth distance L4. The third distance L3 may be smaller than the fourth distance L4.

Referring to FIG. 3D, a first preliminary memory layer pML1 may be formed in the first hole HO1. The first preliminary memory layer pML1 may extend in the third direction D3. The first preliminary memory layer pML1 may penetrate the stack structure STA. The first preliminary memory layer pML1 may be formed along the first sidewalls SW1 of the insulating layers IL and the fourth sidewalls SW4 of the sacrificial layer SL. The first preliminary memory layer pML1 may cover the first sidewalls SW1 of the insulating layers IL, the top surfaces ILT of the insulating layers IL, the bottom surfaces ILB of the insulating layers IL, and the fourth sidewalls SW4 of the sacrificial layers SL. The first preliminary memory layer pML1 may fill the first recesses RC1. In an example, the first preliminary memory layer pML1 may include hafnium zirconium oxide, hafnium oxide, or zirconium oxide. In an example, the first preliminary memory layer pML1 may be doped with silicon, aluminum, yttrium or gadolinium as an impurity. In an example, the first preliminary memory layer pML1 may be amorphous.

The first preliminary memory layer pML1 may include first preliminary memory parts pMP1 and first preliminary dummy parts pDP1. The first preliminary memory parts pMP1 and the first preliminary dummy parts pDP1 may be alternately arranged in the third direction D3. The first preliminary memory parts pMP1 may be in contact with the fourth sidewall SW4 of the sacrificial layer SL. A portion of the first preliminary memory parts pMP1 may be disposed between the insulating layers IL. Another portion of the first preliminary memory parts pMP1 may be disposed between the first preliminary dummy parts pDP1. The first preliminary dummy part pDP1 may be in contact with the first sidewall SW1 of the insulating layer IL.

Second recesses RC2 may be defined by the first preliminary memory parts pMP1. The second recesses RC2 may be defined by inner sidewall pMP1S of the first preliminary memory parts pMP1. The inner sidewall pMP1S of the first preliminary memory part pMP1 may be recessed toward the sacrificial layer SL, to define the second recess RC2. The second recesses RC2 may be spaced apart from each other in the third direction D3. The second recess RC2 may be disposed between the first preliminary dummy parts pDP1. A central level of the second recess RC2 may be equal to that of the first recess RC1 adjacent thereto.

The first preliminary memory part pMP1 and the first preliminary dummy part pDP1 of the first preliminary memory layer pML1 may have the same composition and the same crystal structure. Accordingly, the first preliminary memory part pMP1 and the first preliminary dummy part pDP1 may have the same electrical characteristic.

Referring to FIG. 3E, buffer patterns BP may be formed in the second recesses RC2. The forming of the buffer patterns BP may include forming a buffer layer covering an inner sidewall of the preliminary memory layer pML1 and removing a portion of the buffer layer.

The buffer pattern BP may be in contact with the inner sidewall pMP1S of the first preliminary memory part pMP1 of the first preliminary memory layer pML1. The buffer pattern BP may pressurize the first preliminary memory part pMP1 while being in contact with the first preliminary memory part pMP1. Since the buffer pattern BP and the sacrificial layer SL are disposed at both sidewalls of the first preliminary memory part pMP1, the first preliminary memory part pMP1 may be pressurized.

The buffer pattern BP may be disposed between the first preliminary dummy parts pDP1 of the first preliminary memory layer pML1. The buffer pattern BP may include a material having an etch selectivity with respect to the first preliminary memory layer pML1. In an example, the buffer pattern BP may include titanium nitride.

Referring to FIG. 3F, the first preliminary memory layer pML1 may be crystalized. In an example, the first preliminary memory layer pML1 may be crystalized through a heat treatment process. The crystalized first preliminary memory layer pML1 may be defined as a first memory layer ML1. The first memory layer ML1 may include a first memory part MP1 and a first dummy part DP1. The first memory part MP1 may be formed by crystalizing the first preliminary memory part pMP1. The first dummy part DP1 may be formed by crystalizing the preliminary dummy part pDP1.

The crystalized first memory layer ML1 may include a plurality of single crystals. Some of the plurality of single crystals may have a crystal structure of an orthorhombic system. The first memory part MP1 and the first dummy part DP1 may have the same composition and have different crystal structures. Accordingly, the first memory part MP1 and the first dummy part DP1 may have different electrical characteristics.

The first memory part MP1 may include single crystals having the crystal structure of the orthorhombic system. A volume ratio occupied by the single crystals having the crystal structure of the orthorhombic system at the first memory part MP1 may be defined as a first volume ratio. The first dummy part DP1 may include single crystals having the crystal structure of the orthorhombic system, and might not have the single crystals having the crystal structure of the orthorhombic system. A volume ratio occupied by the single crystals having the crystal structure of the orthorhombic system at the first dummy part DP1 may be defined as a second volume ratio. The first volume ratio may be greater than the second volume ratio.

The first preliminary memory layer pML1 is crystalized in a state in which both the sidewalls of the first preliminary memory part pMP1 are pressurized by the buffer pattern BP and the sacrificial layer SL, and both the sidewalls of the first preliminary dummy part pDP1 are not pressurized. Hence, the first volume ratio of the first memory part MP1 may be greater than the second volume ratio of the first dummy part DP1.

Referring to FIG. 3G, the buffer pattern BP may be selectively removed. When the buffer pattern BP is selectively removed, the second recess RC2 may be again opened. Since the buffer pattern BP includes a material having an etch selectivity with respect to the first memory layer ML1, the buffer pattern BP may be selectively removed.

Referring to FIG. 3H, a channel layer CL may be formed in the first memory layer ML1. The channel layer CL may include protrusion parts PT filling the second recesses RC2 and a base part BA penetrating the stack structure STA.

Figure 3I:
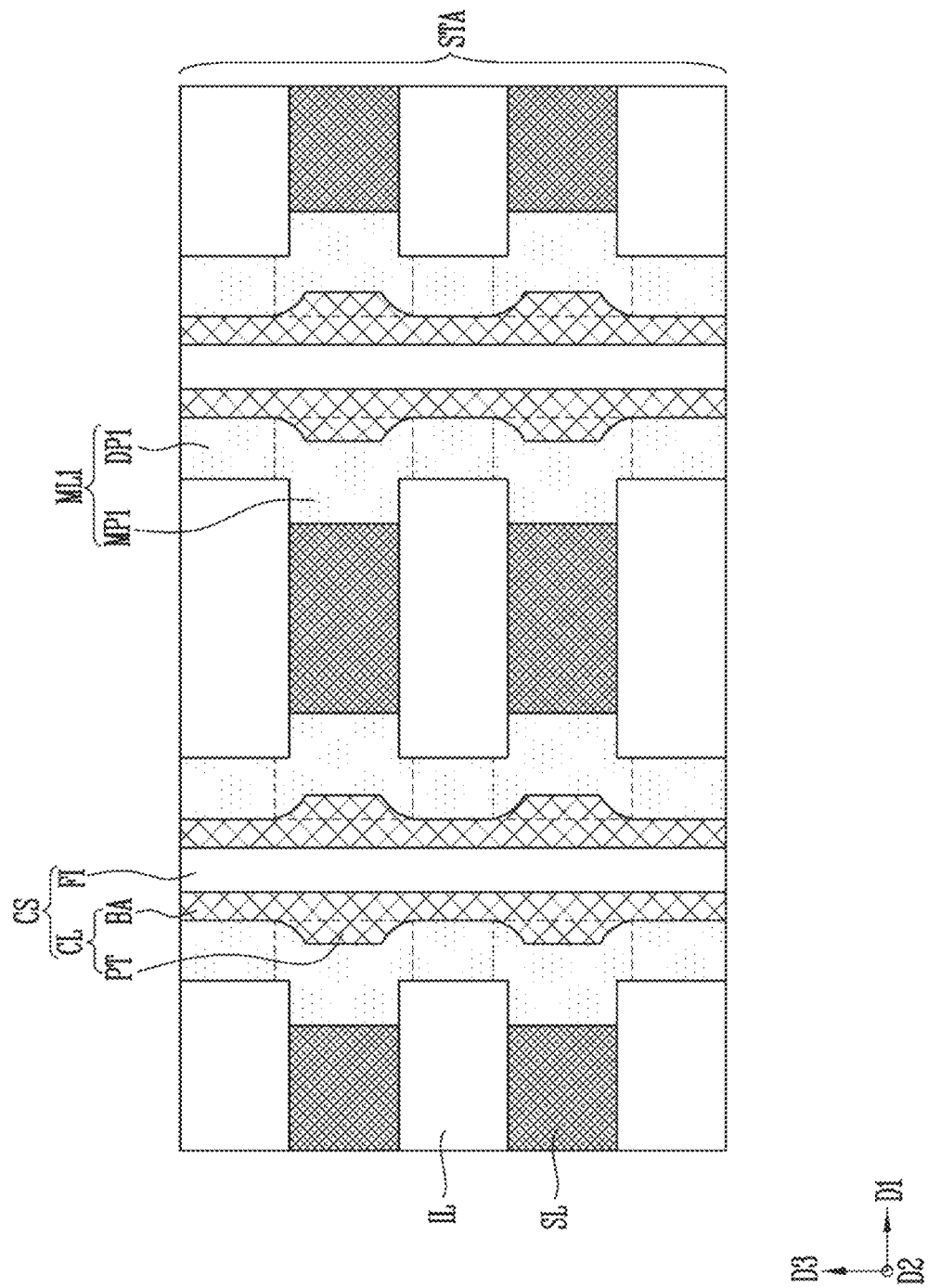

Referring to FIG. 3I, a filling layer FI may be formed in the channel layer CL. Subsequently, the sacrificial layer SL may be replaced with conductive patterns CP (see FIG. 2B). The replacing of the sacrificial layers SL with the conductive patterns CP may include forming a slit penetrating the stack structure STA, removing the sacrificial layers SL through the slit, and forming the conductive patterns CP in an empty spaces formed by removing the sacrificial layers SL.

The manufacturing method of the semiconductor device in accordance with this embodiment may include forming the buffer pattern BP pressurizing the first preliminary memory part pMP1. Accordingly, the first memory part MP1 may have ferroelectricity and the first dummy part DP1 may have praraelectricity. Alternatively, both the first memory part MP1 and the first dummy part DP1 may have ferroelectricity, and the first memory part MP1 may have ferroelectricity stronger than that of the first dummy part DP1. Thus, although a voltage is applied to a word line, the first dummy part DP1 is not polarized or may be relatively weakly polarized. Accordingly, disturbance and interference, which are caused by polarization of the first dummy part DP1, can be minimized.

In the manufacturing method of the semiconductor device in accordance with this embodiment, the first memory part MP1 and the first dummy part DP1 can be formed to have different electrical characteristics. Accordingly, cost and time can be reduced, and the uniformity of processes can be improved.

Figure 4B:
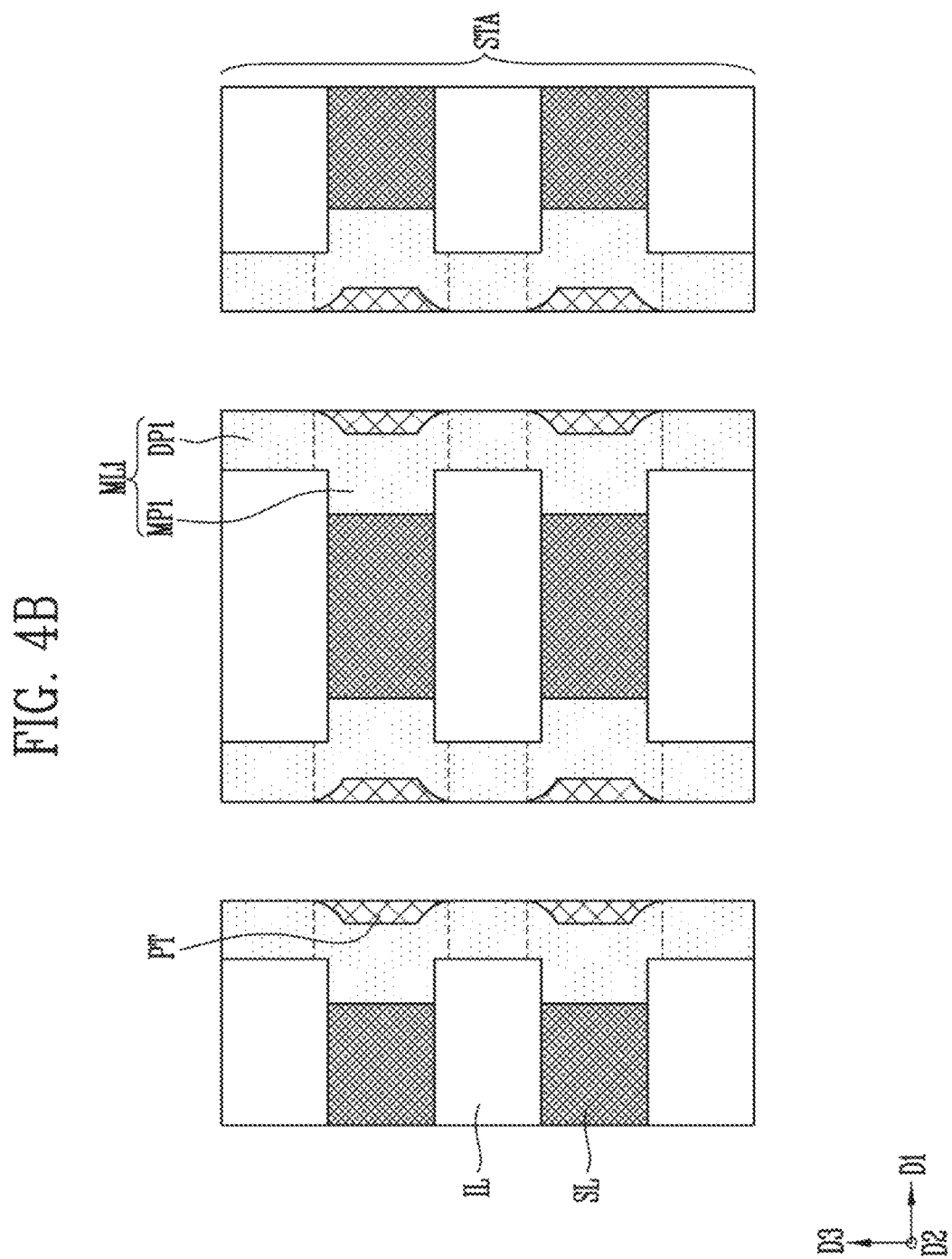

FIGS. 4A to 4C are sectional views illustrating a manufacturing method of the semiconductor device shown in FIGS. 2A and 2B.

For convenience of description, components identical to those described with reference to FIGS. 2A, 2B, and 3A to 3I are designated by like reference numerals, and overlapping descriptions will be omitted.

The manufacturing method described below is merely an embodiment of a method of manufacturing the semiconductor memory device shown in FIGS. 2A and 2B, and the method of manufacturing the semiconductor memory device shown in FIGS. 2A and 2B might not be limited to the manufacturing method described below.

Referring to FIG. 4A, similarly to as described in FIGS. 3A to 3D, the stack structure STA and the first preliminary memory layer pML1 may be formed.

Subsequently, the protrusion part PT may be formed in the second recesses RC2 defined by the first preliminary memory layer pML1, In an example, the protrusion part PT may include poly-silicon. The forming of the protrusion part PT may include forming a semiconductor material layer covering an inner sidewall of the first preliminary memory layer pML1 and etching a portion of the semiconductor material layer.

The protrusion part PT may be in contact with the inner sidewall pMP1S of the first preliminary memory part pMP1. The protrusion part PT may pressurize the first preliminary memory part pMP1 while being in contact with the first preliminary memory part pMP1. Since the protrusion part PT and the sacrificial layer SL are disposed at both the sidewalls of the first preliminary memory part pMP1, the first preliminary memory part pMP1 may be pressurized. The protrusion part PT may be disposed between the first preliminary dummy parts pDP1 of the first preliminary memory layer pML1.

Referring to FIG. 4B, the first preliminary memory layer pML1 may be crystalized. The first preliminary memory layer pML1 is crystalized in a state in which both the sidewalls of the first preliminary memory part pMP1 are pressurized by the protrusion part PT and the sacrificial layer SL. Hence, a volume ratio occupied by single crystals having a crystal structure of an orthorhombic system at the first memory part MP1 may be greater than that occupied by single crystals having the crystal structure of the orthorhombic system at the first dummy part DP1.

Referring to FIG. 4C, the base part BA may be formed in the first memory layer ML1. The base part BA may be connected to the protrusion parts PT. The base part BA and the protrusion parts PT may include the same material. The base part BA and the protrusion parts PT may constitute the channel layer CL.

Subsequently, similarly to as described in FIG. 3I, the filling layer may be formed. Subsequently, the sacrificial layer SL may be replaced with the conductive patterns CP (see FIG. 2B).

FIG. 5 is a sectional view of a semiconductor device in accordance with an embodiment of the present disclosure.

The semiconductor device in accordance with this embodiment may be similar to the semiconductor device shown in FIGS. 2A and 1B, except portions described below.

Referring to FIG. 5, the semiconductor device in accordance with this embodiment may include a stack structure STA. The stack structure STA may include conductive patterns CP arranged in a third direction D3. Each of the conductive patterns CP may include a gate conductive layer GC and a barrier layer BR surrounding the gate conductive layer GC.

Air gaps AR may be defined between the conductive patterns CP. The air gaps AR may be substantially empty spaces between the conductive patterns CP. The conductive patterns CP may be spaced apart from each other by the air gaps AR.

A second memory layer ML2 and a channel structure CS may be provided, which penetrate the stack structure STA.

The second memory layer ML2 may include second memory parts MP2 and second dummy parts DP2. The second memory parts MP2 and the second dummy parts DP2 may be alternately arranged in the third direction D3. The second memory part MP2 may be disposed between the channel structure CS and the conductive pattern CP. The second dummy part DP may be disposed between the channel structure CS and the air gap AR. The second memory part MP2 may be disposed at the same level as the conductive pattern CP. The second dummy part DP2 may be disposed at the same level as the air gap AR. A level of a boundary BO between the second memory part MP2 and the second part DP2 may be equal to that of a top surface CPT of the conductive pattern CP or that of a bottom surface CPL of the conductive pattern CP. The second memory part MP2 may be in contact with a sidewall of the conductive pattern CP. The second dummy part DP2 may be in contact with the air gap AR.

Similarly to the first memory part MP1 and the first dummy part DP1, which are shown in FIGS. 2A and 2B, the second memory part MP2 and the second dummy part DP2 may have the same composition, and a volume ratio occupied by single crystals having a crystal structure of an orthorhombic system at the second memory part MP2 may be greater than that occupied by single crystals having the crystal structure of the orthorhombic system at the second dummy part DP2.

In an example, both the second memory part MP2 and the second dummy part DP2 may have ferroelectricity, and the second memory part MP2 may have ferroelectricity stronger than that of the second dummy part DP2. In another example, the second memory part MP2 may have ferroelectricity and the second dummy part DP2 may have paraelectricity.

The channel structure CS may include a channel layer CL and a filling layer FI in the channel layer CL.

Figure 6C:
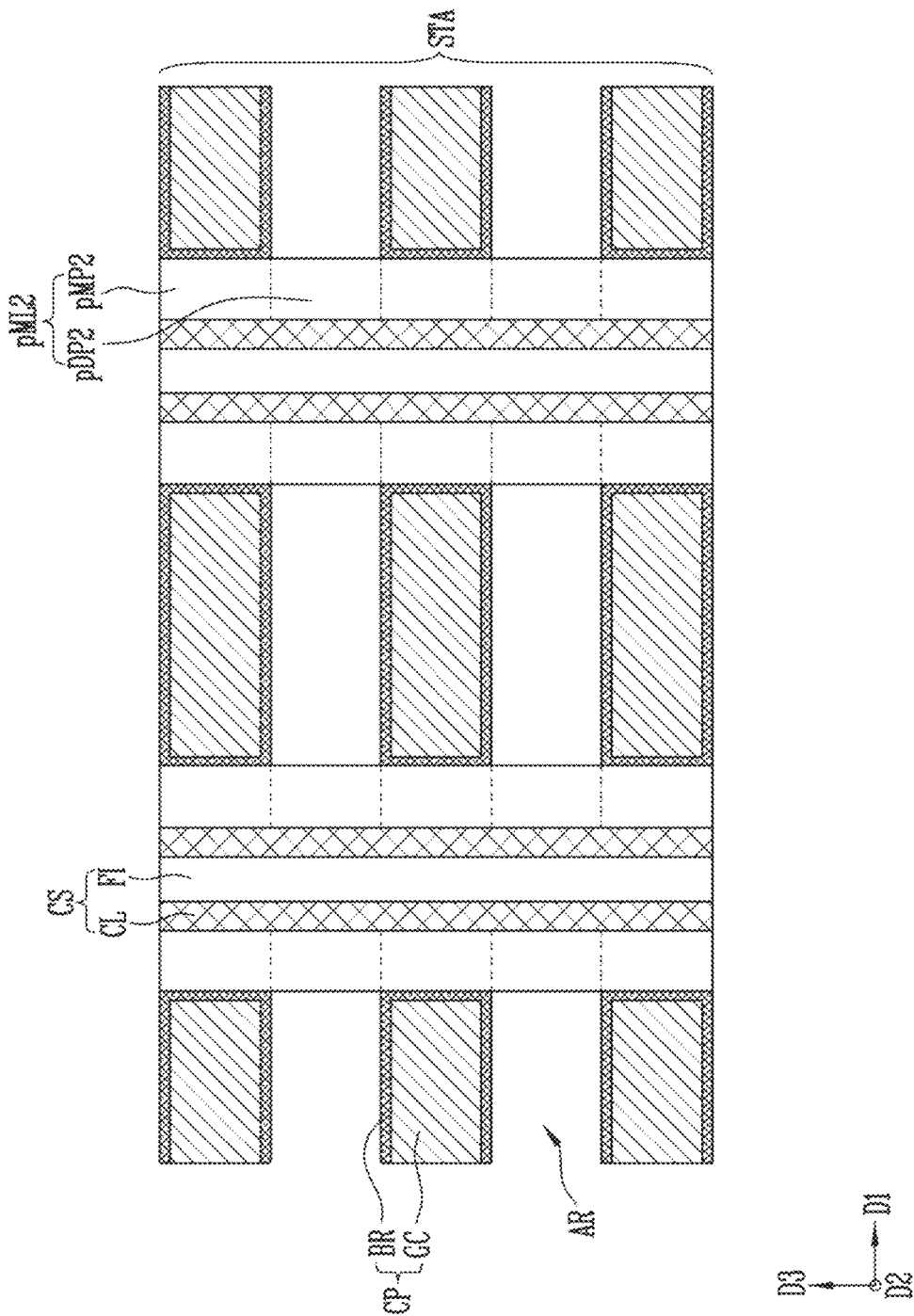

FIGS. 6A to 6C are sectional views illustrating a manufacturing method of the semiconductor device shown in FIG. 5.

For convenience of description, components identical to those described with reference to FIG. 5 are designated by like reference numerals, and overlapping descriptions will be omitted.

The manufacturing method described below is merely an embodiment of a method of manufacturing the semiconductor memory device shown in FIG. 5, and the method of manufacturing the semiconductor memory device shown in FIG. 5 might not be limited to the manufacturing method described below.

Referring to FIG. 6A, a stack structure STA may be formed, which includes sacrificial layers SL and insulating layers IL. Subsequently, a second preliminary memory layer pML2 and a channel structure CS may be formed, which penetrate the stack structure STA.

The forming of the second preliminary memory layer pML2 and the channel structure CS may include forming a second hole HO2 penetrating the stack structure STA and sequentially forming, in the second hole HO2, the second preliminary memory layer pML2, a channel layer CL, and a filling layer FI. In an example, the second preliminary memory layer pML2 may include hafnium zirconium oxide, hafnium oxide, or zirconium oxide. In an example, the second preliminary memory layer pML2 may be doped with silicon, aluminum, yttrium or gadolinium as an impurity.

The second preliminary memory layer pML2 may include a second preliminary memory part pMP2 and a second preliminary dummy part pDP2. The second preliminary memory part pMP2 may be disposed between the sacrificial layer SL and the channel layer CL. The second preliminary dummy part pDP2 may be disposed between the insulating layer IL and the channel layer CL.

Referring to FIG. 6B, the sacrificial layers SL may be replaced with conductive patterns CP. The replacing of the sacrificial layers SL with the conductive patterns CP may include forming a first slit penetrating the stack structure STA, removing the sacrificial layers SL through the first slit, and forming the conductive patterns CP in empty spaces formed by removing the sacrificial layers SL. The second preliminary memory part pMP2 of the second preliminary memory layer pML2 may be disposed between the conductive pattern CP and the channel layer CL.

Referring to FIG. 6C, the insulating layers IL between the conductive patterns CP may be removed. When the insulating layers IL are removed, air gaps AR may be formed between the conductive patterns CP. The removing of the insulating layers IL may include forming a second slit penetrating the stack structure STA and removing the insulating layers IL through the second slit. In an embodiment, the second slit may be the same component as the first slit described in FIG. 6B. In another embodiment, the second slit may be a component different from the first slit described in FIG. 6B.

When the air gap AR is formed by removing the insulating layer IL, the second preliminary dummy part pDP2 may be exposed. The second preliminary dummy part pDP2 may be disposed between the air gap AR and the channel structure CS. Both sidewalls of the second preliminary memory part pMP2 may be pressurized by the conductive pattern CP and the channel structure CS. Since the second preliminary dummy part pDP2 is disposed between the air gap AR and the channel structure CS, both sidewalk of the second preliminary dummy part pDP2 might not be pressurized.

Subsequently, the second preliminary memory layer pML2 may be crystalized. When the second preliminary memory layer pML2 is crystalized, a second memory layer ML2 may be formed (see FIG. 5). A second memory part MP2 may be formed by crystalizing the second preliminary memory part pMP2, and a second dummy part DP2 may be formed by crystalizing the second preliminary dummy part pDP2. The second preliminary memory layer pML2 is crystalized in a state in which the second preliminary memory part pMP2 is pressurized by the conductive pattern CP and the channel structure CS, and the second preliminary dummy part pDP2 is exposed by the air gap AR. Hence, a volume ratio occupied by single crystals having a crystal structure of an orthorhombic system may be greater than that occupied by single crystals having the crystal structure of the orthorhombic system.

FIG. 7 is a sectional view of a semiconductor device in accordance with an embodiment of the present disclosure.

The semiconductor device in accordance with this embodiment may be similar to the semiconductor device shown in FIG. 5, except portions described below.

Referring to FIG. 7, the stack structure may include insulating patterns IP and conductive patterns CP, which are alternately stacked. The insulating patterns IP may include an insulating material. In an example, the insulating patterns IP may include oxide.

The second memory layer ML2 penetrating the stack structure STA may include the second memory part MP2 and the second dummy part DP2. The second memory part MP2 and the second dummy part DP2 may have the same composition, and a volume ratio of single crystals having a crystal structure of an orthorhombic system at the second memory part MP2 may be greater than that of single crystals having the crystal structure of the orthorhombic system at the second dummy part DP2. The second memory part MP2 may be disposed at the same level as the conductive pattern CP, and the second dummy part DP2 may be disposed at the same level as the insulating pattern IP.

The channel structure CS including the channel layer CL and the filling layer FI may be provided in the second memory layer ML2.

The semiconductor memory device in accordance with this embodiment may be manufactured by forming the second memory layer ML2 including the second memory part MP2 and the second dummy part DP2 and then forming the insulating patterns IP in the air gaps AR as described in FIGS. 6A to 6C.

Figure 8:
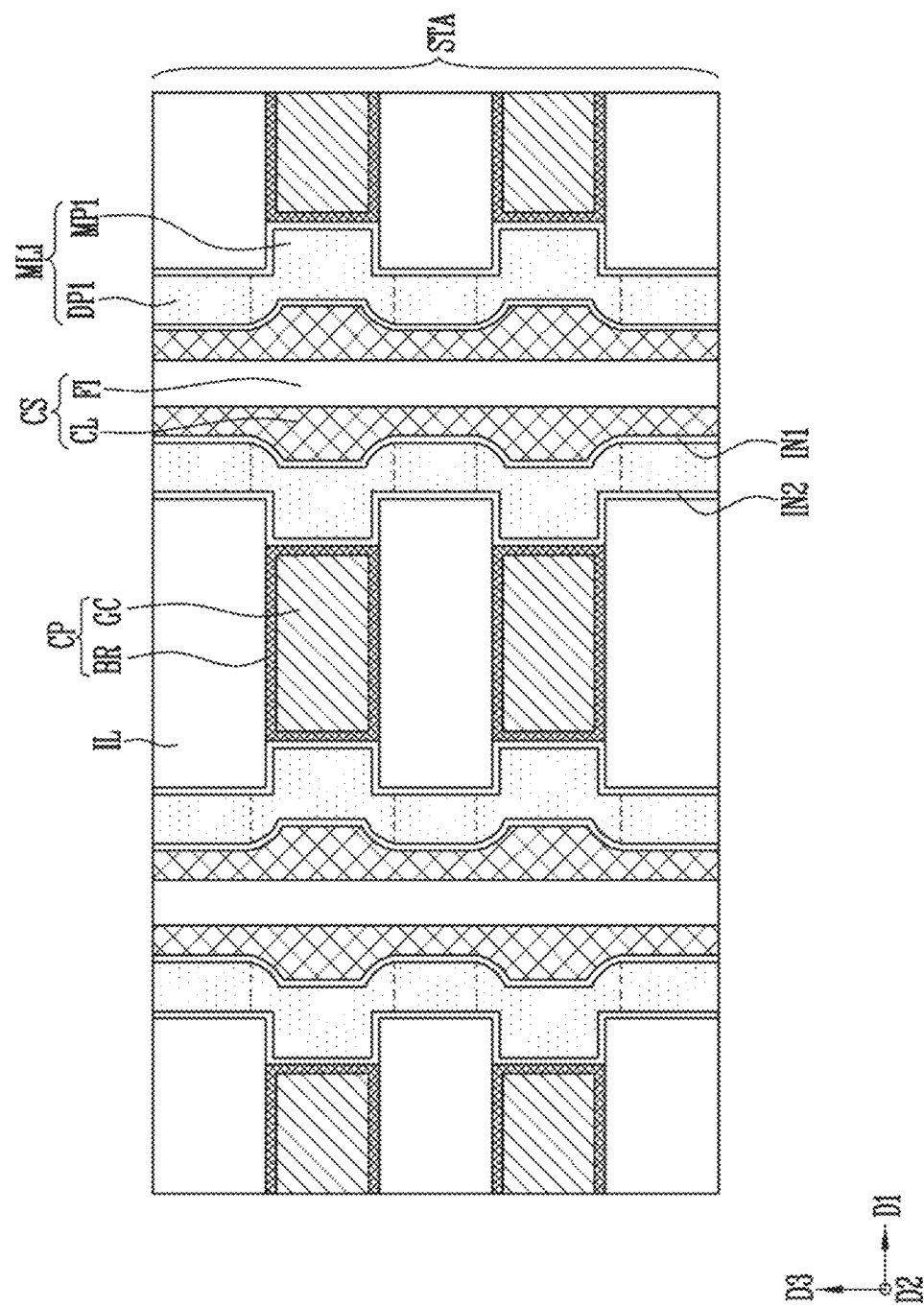
FIG. 8 is a sectional view of a semiconductor device in accordance with an embodiment of the present disclosure.

FIG. 8 is a sectional view of a semiconductor device in accordance with an embodiment of the present disclosure.

The semiconductor device in accordance with this embodiment may be similar to the semiconductor device shown in FIGS. 2A and 2B, except portions described below.

Referring to FIG. 8, the semiconductor device in accordance with this embodiment may include a first interposing layer IN1 and a second interposing layer IN2.

The first interposing layer IN1 may be disposed between the channel structure CS and the first memory layer ML1. The first interposing layer IN1 may surround the channel structure CS. The first memory layer ML1 may surround the first interposing layer IN1. The first interposing layer IN1 may be in contact with an outer sidewall of the channel layer CL of the channel structure CS. The first interposing layer IN1 may be in contact with an inner sidewall of the first memory layer ML1.

The second interposing layer IN2 may be disposed between the first memory layer ML1 and the stack structure STA. The second interposing layer IN2 may surround the first memory layer ML1. The conductive patterns CP and the insulating layers IL of the stack structure STA may surround the second interposing layer IN2. The second interposing layer IN2 may be in contact with an outer sidewall of the first memory layer ML1. The second interposing layer IN2 may be in contact with the conductive patterns CP and the insulating layer IL.

The first memory layer ML1 may be disposed between the first and second interposing layers IN1 and IN2. The first and second interposing layers IN1 and IN2 may include silicon oxide or hafnium oxide. The first and second interposing layers IN1 and IN2 are formed so that interface characteristics of the first memory layer ML1 can be improved, and degradation of ferroelectric characteristics of the first memory part MP1 of the first memory layer ML1 can be prevented.

Figure 9:
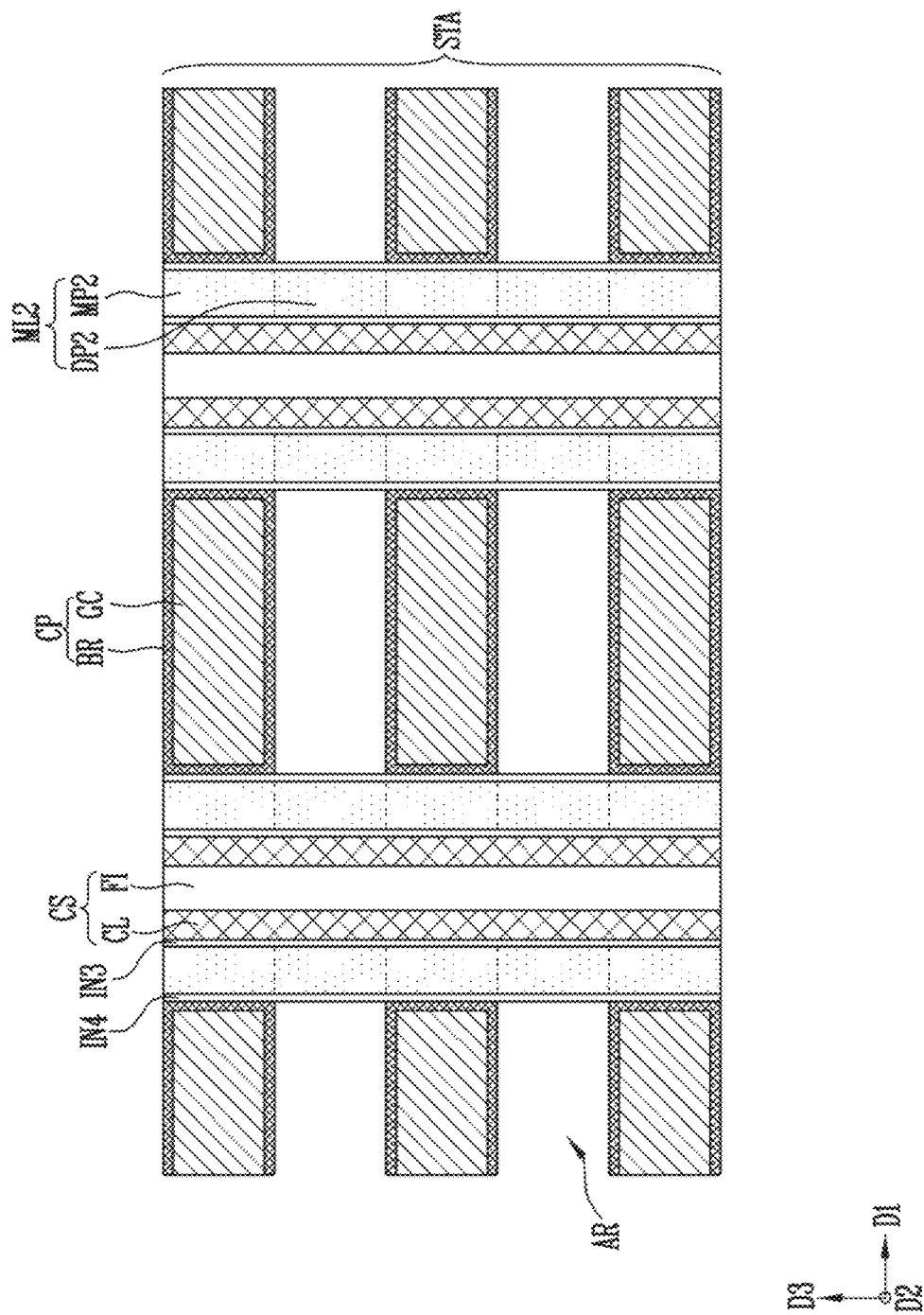
FIG. 9 is a sectional view of a semiconductor device in accordance with an embodiment of the present disclosure.

FIG. 9 is a sectional view of a semiconductor device in accordance with an embodiment of the present disclosure.

The semiconductor device in accordance with this embodiment may be similar to the semiconductor device shown in FIG. 5, except portions described below.

Referring to FIG. 9, the semiconductor device in accordance with this embodiment may include a third interposing layer IN3 and a fourth interposing layer IN4.

The third interposing layer IN3 may be disposed between the channel structure CS and the second memory layer ML2. The third interposing layer IN3 may surround the channel structure CS. The second memory layer ML2 may surround the third interposing layer IN3. The third interposing layer IN3 may be in contact with an outer sidewall of the channel layer CL of the channel structure CS. The third interposing layer IN3 may be in contact with an inner sidewall of the second memory layer ML2.

The fourth interposing layer IN4 may be interposed between the second memory layer ML2 and the stack structure STA. The fourth interposing layer may surround the second memory layer ML2. The conductive patterns CP of the stack structure STA may surround the fourth interposing layer IN4. The fourth interposing layer IN4 may be in contact with an outer sidewall of the second memory layer ML2. The fourth interposing layer IN4 may be in contact with the conductive patterns CP.

The second memory layer ML2 may be disposed between the third and fourth interposing layers IN3 and IN4. The third and fourth interposing layers IN3 and IN4 may include an insulating material. In an example the third and fourth interposing layers IN3 and IN4 may include silicon oxide or hafnium oxide. The third and fourth interposing layers IN3 and IN4 are formed, so that interface characteristics of the second memory layer ML2 can be improved, and degradation of ferroelectric characteristics of the second memory part MP2 of the second memory layer ML2 can be prevented.

Figure 10:
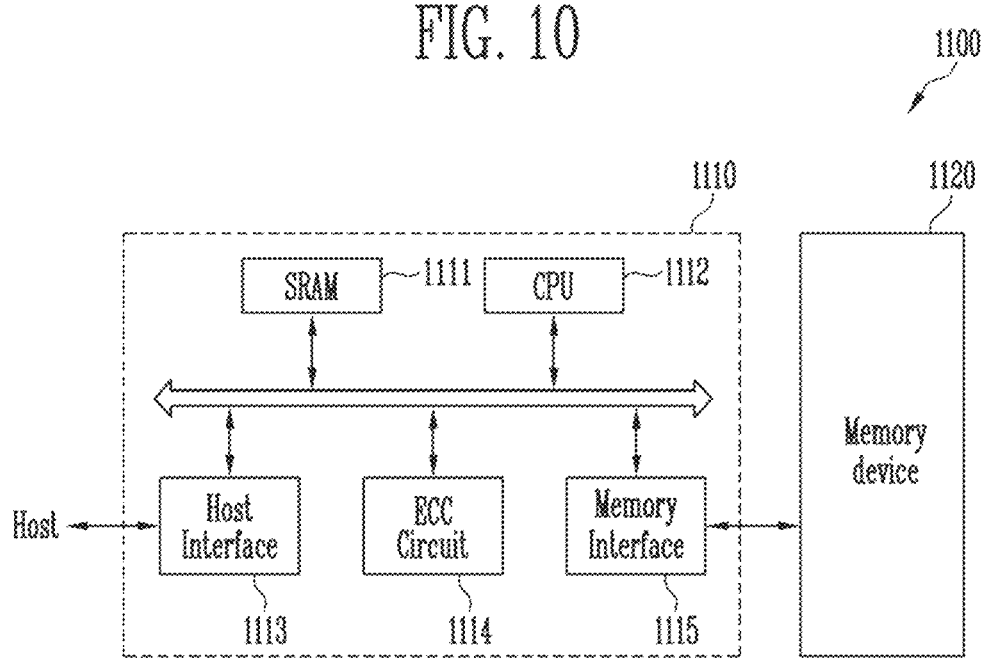
FIG. 10 is a block diagram illustrating a configuration of a memory system in accordance with an embodiment of the present disclosure.

FIG. 10 is a block diagram illustrating a configuration of a memory system in accordance with an embodiment of the present disclosure.

Referring to FIG. 10, the memory system 1100 in accordance with the embodiment of the present disclosure includes a memory device 1120 and a memory controller 1110.

The memory device 1120 may include the structures described with reference to FIGS. 2A and 2B, 5, 7, 8, and 9. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer Small Interface (SCSI) protocol, an Enhanced Small Disk Interface (ESDI) protocol, and an Integrated Drive Electronics (IDE) protocol.

Figure 11:
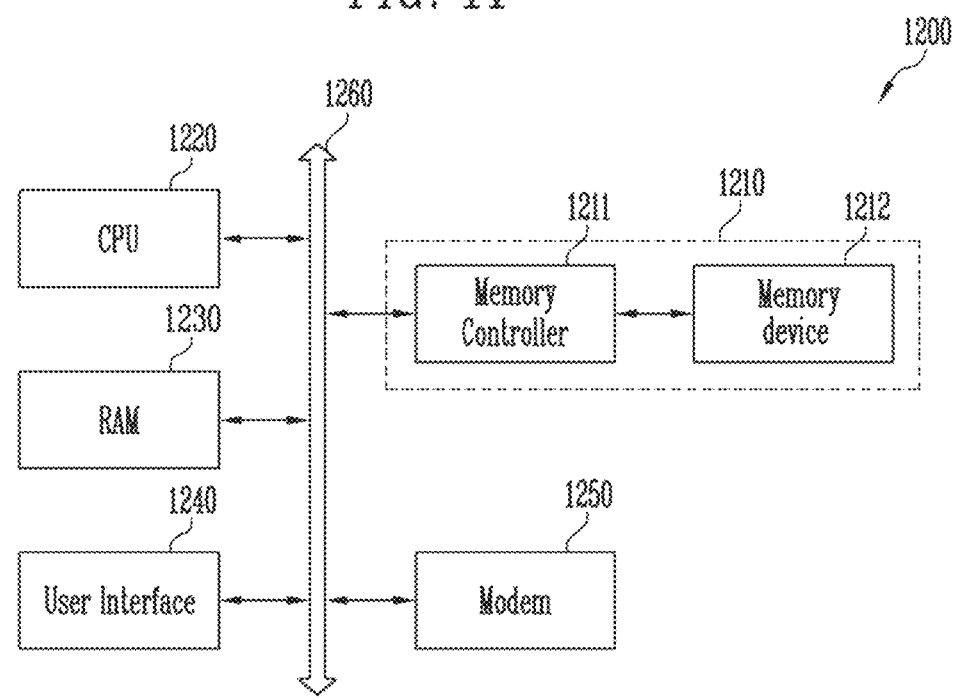
FIG. 11 is a block diagram illustrating a configuration of a computing system in accordance with an embodiment of the present disclosure.

FIG. 11 is a block diagram illustrating a configuration of a computing system in accordance with an embodiment of the present disclosure.

Referring to FIG. 11, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211 as described with reference to FIG. 10.

In the semiconductor device in accordance with the present disclosure, a memory part of a memory layer may have ferroelectricity stronger than that of a dummy part of the memory layer. Alternatively, the dummy part of the memory layer may have paraelectricity. Accordingly, disturbance and interference, which are caused by polarization of the dummy part, can be minimized.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
a stack structure including conductive patterns and insulating layers, which are alternately stacked;
a channel structure penetrating the stack structure; and
a memory layer penetrating the stack structure, the memory layer being disposed between the channel structure and the stack structure,
wherein the memory layer includes memory parts and dummy parts, which are alternately arranged,
wherein each of the memory parts includes a first part between the insulating layers and a second part between the dummy parts, and
wherein the first part of each of the memory parts is spaced apart from the dummy parts and has ferroelectricity.

2. The semiconductor device of claim 1,
wherein the second part of each of the memory parts and the dummy parts have ferroelectricity, and
wherein a maximum residual polarization intensity of the memory parts is greater than that of the dummy parts.

3. The semiconductor device of claim 2, wherein a volume ratio of single crystals having a crystal structure of an orthorhombic system at each of the memory parts is greater than that of single crystals having the crystal structure of the orthorhombic system at each of the dummy parts.

4. The semiconductor device of claim 2, wherein the memory parts and the dummy parts have the same composition.

5. The semiconductor device of claim 2, wherein an absolute value of a coercive electric field of the memory parts is greater than that of a coercive electric field of the dummy parts.

6. The semiconductor device of claim 1, wherein the channel structure includes protrusion parts protruding toward the conductive patterns.

7. The semiconductor device of claim 6, wherein the protrusion parts are disposed between the dummy parts.

8. The semiconductor device of claim 7, wherein the dummy parts have paraelectricity.

9. The semiconductor device of claim 2, wherein central levels of one of the conductive patterns and one of the memory parts, which are adjacent to each other, are substantially the same.

10. A semiconductor device comprising:
a stack structure including conductive patterns and insulating layers, which are alternately stacked;
a channel structure penetrating the stack structure; and
a memory layer penetrating the stack structure, the memory layer being disposed between the channel structure and the stack structure,
wherein the memory layer includes memory parts and dummy parts, which are alternately arranged,
wherein each of the memory parts includes a first part between the insulating layers and a second part between the dummy parts,
wherein the dummy parts are disposed between the insulating layers and the channel structure and in contact with the insulating layers, and
wherein the memory parts have ferroelectricity and the dummy parts have paraelectricity.

11. The semiconductor device of claim 10, wherein the first part is in contact with a top surface of one of the insulating layers and a bottom surface of another one of the insulating layers.

12. The semiconductor device of claim 10, wherein the channel structure includes protrusion parts protruding toward the conductive patterns.

13. The semiconductor device of claim 12, wherein the protrusion parts are disposed between the dummy parts.

14. The semiconductor device of claim 12,
wherein a central level of each of the dummy parts is substantially equal to that of each of the insulating layers, and
wherein a central level of each of the protrusion parts is substantially equal to that of each of the conductive patterns.

15. The semiconductor device of claim 10, further comprising a filling layer penetrating the stack structure, the filling layer being disposed in the channel structure,
wherein a shortest distance between the conductive patterns and the filling layer is greater than that between the insulating layers and the filling layer.

16. The semiconductor device of claim 10, further comprising an interposing layer between the memory layer and the stack structure.

17. The semiconductor device of claim 16, wherein the interposing layer includes at least one of silicon oxide and hafnium oxide.

* * * * *